United States Patent
Lee et al.

(10) Patent No.: US 11,063,592 B2
(45) Date of Patent: Jul. 13, 2021

(54) INTEGRATED CLOCK GATING CIRCUIT

(71) Applicant: SAMSUNG ELECTRONICS CO., LTD., Suwon-si (KR)

(72) Inventors: Youngo Lee, Suwon-si (KR); Ahreum Kim, Daegu (KR); Minsu Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/991,659

(22) Filed: Aug. 12, 2020

(65) Prior Publication Data

US 2021/0143820 A1 May 13, 2021

(30) Foreign Application Priority Data

Nov. 12, 2019 (KR) .......................... 10-2019-0144246

(51) Int. Cl.
| | |
|---|---|
| *H03K 19/00* | (2006.01) |
| *H03K 3/037* | (2006.01) |
| *H03K 3/33* | (2006.01) |
| *G06F 1/08* | (2006.01) |
| *H03K 17/687* | (2006.01) |

(52) U.S. Cl.
CPC .......... *H03K 19/0016* (2013.01); *G06F 1/08* (2013.01); *H03K 3/037* (2013.01); *H03K 17/6872* (2013.01)

(58) Field of Classification Search
CPC combination set(s) only.
See application file for complete search history.

(56) References Cited

U.S. PATENT DOCUMENTS

| | | | |
|---|---|---|---|
| 6,838,941 B2 * | 1/2005 | Yamamoto | ............. H03F 1/302 330/124 R |
| 7,639,057 B1 * | 12/2009 | Su | ............................. G06F 1/10 326/93 |
| 7,795,943 B2 | 9/2010 | Toyonoh et al. | |
| 8,099,702 B2 | 1/2012 | Hou et al. | |
| 8,887,114 B2 | 11/2014 | Hill et al. | |
| 8,890,573 B2 * | 11/2014 | Elkin | ............... H03K 3/356026 326/98 |
| 9,362,910 B2 | 6/2016 | Gurumurthy et al. | |
| 9,779,201 B2 | 10/2017 | Millar et al. | |
| 10,014,862 B2 | 7/2018 | Hwang et al. | |

(Continued)

FOREIGN PATENT DOCUMENTS

JP    2007-72995 A    3/2007

*Primary Examiner* — An T Luu
(74) *Attorney, Agent, or Firm* — Sughrue Mion, PLLC

(57) ABSTRACT

An integrated circuit gating circuit includes a first control stage that outputs a first internal signal based on an enable signal and a clock signal, a second control stage that outputs a second internal signal based on the first internal signal and the clock signal, and an output driver that outputs an output clock signal based on the second internal signal. The second control stage includes a first multi-finger transistor that is connected between a second node outputting the second internal signal and the 0-th node and operates based on the clock signal. A first portion of the first multi-finger transistor is formed in a first row defined on a semiconductor substrate, and a second portion of the first multi-finger transistor is formed in a second row defined on the semiconductor substrate.

20 Claims, 27 Drawing Sheets

(56) References Cited

U.S. PATENT DOCUMENTS

| | | |
|---|---|---|
| 10,177,765 B2 | 1/2019 | Hsu et al. |
| 10,298,235 B2 | 5/2019 | Lim et al. |
| 10,355,674 B2 | 7/2019 | Baratam et al. |
| 10,819,342 B2 * | 10/2020 | Berzins .............. H03K 19/0016 |
| 2015/0033050 A1 | 1/2015 | Qadan et al. |

* cited by examiner

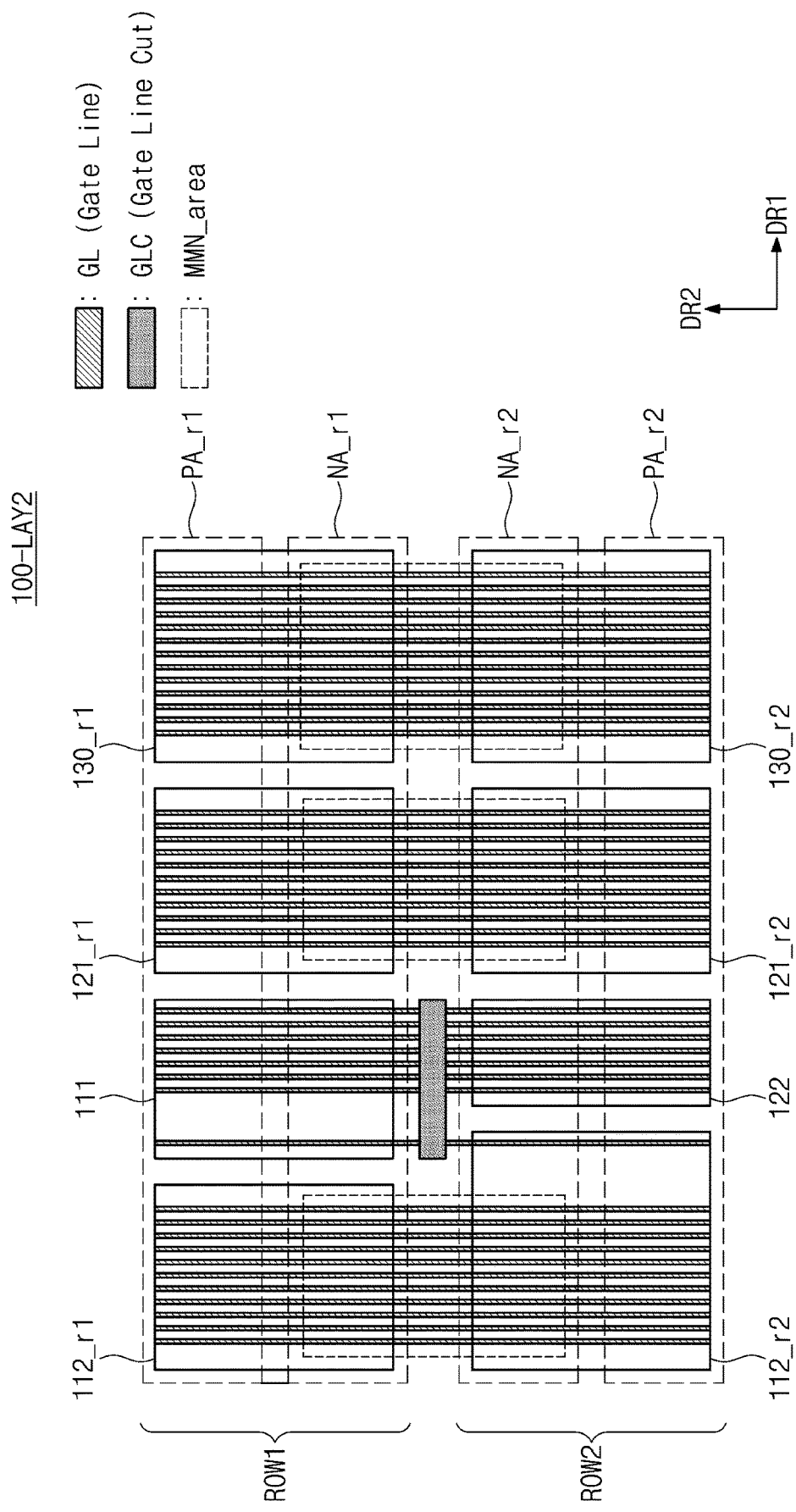

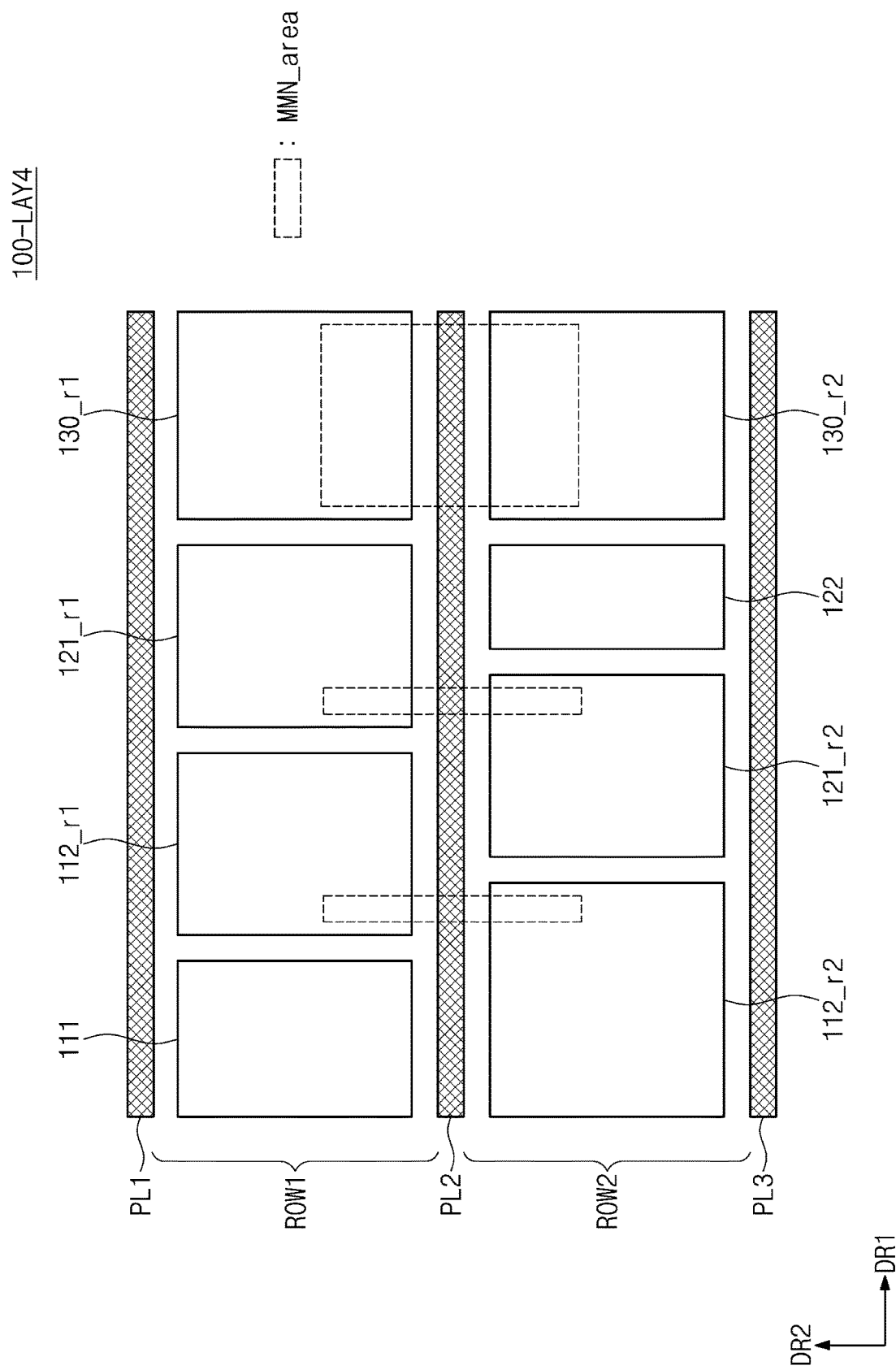

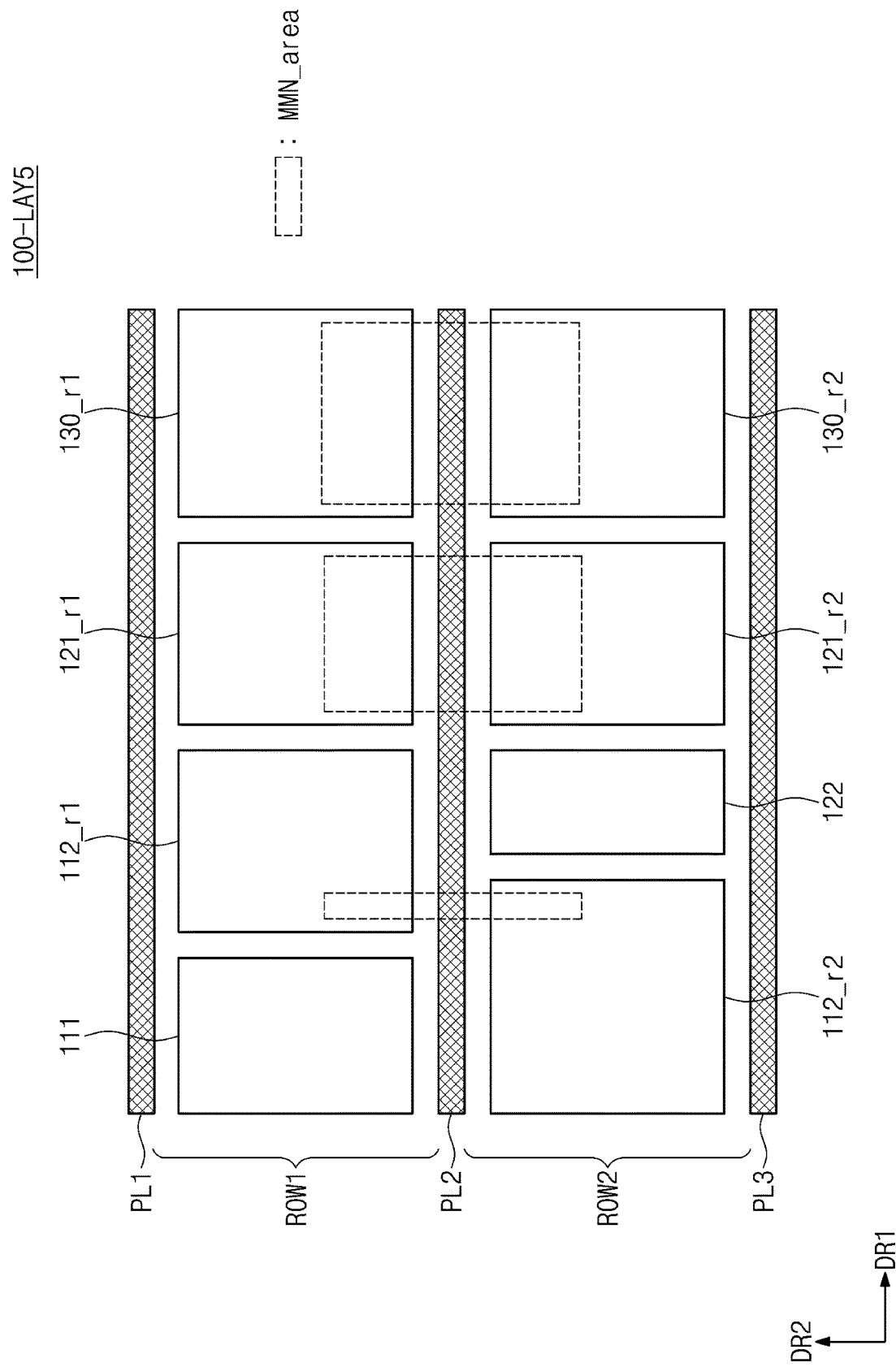

INTEGRATED CLOCK GATING CIRCUIT

CROSS-REFERENCE TO RELATED APPLICATIONS

This application is based on and claims priority under 35 U.S.C. § 119 to Korean Patent Application No. 10-2019-0144246 filed on Nov. 12, 2019, in the Korean Intellectual Property Office, the disclosures of which are incorporated by reference herein in their entireties.

BACKGROUND

1. Field

Embodiments of the inventive concept described herein relate to a semiconductor device, and more particularly, relate to an integrated clock gating circuit and a standard cell layout for the integrated clock gating circuit.

2. Description of Related Art

A digital system includes a plurality of function blocks, and the plurality of function blocks perform various calculation operations based on a clock signal. While the digital system is in operation, all the function blocks may not be in operation at all times. Accordingly, in order to reduce power consumption and heat generation, it is necessary to inhibit the clock signal from being supplied to a block that is not currently in operation. In the digital system, a clock gating circuit inhibits a clock signal that is supplied to a function block not in operation. Recently, there is a demand for high speed clock gating circuits with reduced power consumption. However, with the development of the nano-scale manufacturing technology, it is difficult to implement a high-speed operation of the clock gating circuit.

SUMMARY

Embodiments of the inventive concept provide an integrated clock gating circuit having improved performance.

Embodiments of the inventive concept provide an integrated clock gating circuit having improved performance in speed and power consumption characteristics.

According to an aspect of the disclosure, there is provided an integrated circuit gating circuit comprising: a first control stage configured to output a first internal signal based on an enable signal and a clock signal; a second control stage connected to the first control stage through a first node, and configured to output a second internal signal based on the first internal signal and the clock signal; and an output driver configured to output an output clock signal based on the second internal signal, wherein the second control stage includes a first multi-finger transistor connected between a second node outputting the second internal signal and the first node, and configured to operate based on the clock signal, and wherein a first portion of the first multi-finger transistor is formed in a first row on a semiconductor substrate between a first power line and a second power line, and a second portion of the first multi-finger transistor is formed in a second row on the semiconductor substrate between the second power line and a third power line.

According to another aspect of the disclosure, there is provided an integrated circuit gating circuit comprising: a clock signal control circuit configured to output a first internal signal based on a clock signal and a voltage level at a first node; an enable signal control circuit configured to operate based on the first internal signal, an enable signal, and an inverted second internal signal; an output control circuit connected to the first node, and configured to output a second internal signal based on the clock signal and the first internal signal; a feedback inverter configured to invert the second internal signal and output the inverted second internal signal; and an output driver configured to output an output clock signal based on the second internal signal, wherein the clock signal control circuit is provided in a first row of a semiconductor substrate, wherein the enable signal control circuit is distributed and arranged in the first row and a second row of the semiconductor substrate, wherein the output control circuit is distributed and arranged at the first row and the second row, wherein the feedback inverter is provided at the second row, and wherein the output driver is distributed and arranged at the first row and the second row.

According to another aspect of the disclosure, there is provided an integrated circuit gating circuit comprising: a control circuit configured to output a first internal signal based on an enable signal and a clock signal; and an output driver configured to output an output clock signal, which is obtained by gating the clock signal, based on the first internal signal, wherein each of the control circuit and the output driver is distributed and arranged at a plurality of rows of a semiconductor substrate, which are separated by one or more power lines, wherein the control circuit includes a first multi-finger transistor configured to operate based on the clock signal and a second multi-finger transistor configured to operate the enable signal, wherein a first portion of the first multi-finger transistor is provided in a first row, and a second portion of the first multi-finger transistor is provided a second row, and wherein a third portion of the second multi-finger transistor is provided in the first row, and a fourth portion of the second multi-finger transistor is provided in the second row.

According to another aspect of the disclosure, there is provided an integrated circuit gating circuit comprising: a semiconductor substrate; a plurality of power lines, each extending in a first direction, and spaced apart from each other in a second direction; a first row area provided between a first power line and a second power line, among the plurality of power lines, the first row area extending in the first direction; a second row area provided between the second power line and a third power line, among the plurality of power lines, the second row area extending in the first direction; and one or more multi-finger transistors, each overlapping the first row area and the second row area in a plan view.

BRIEF DESCRIPTION OF THE FIGURES

The above and other objects and features of the inventive concept will become apparent by describing in detail exemplary embodiments thereof with reference to the accompanying drawings.

FIGS. 8A to 8C are diagrams illustrating a second layout of FIG. 5B.

FIGS. 10A to 10D are diagrams illustrating various layouts of an ICG according to an embodiment of the inventive concept.

DETAILED DESCRIPTION

Below, embodiments of the inventive concept may be described in detail and clearly to such an extent that an ordinary one in the art easily implements the inventive concept.

Components described in the detailed description with reference to the terms "part", "unit", "module", etc. and function blocks illustrated in drawings may be implemented in the form of hardware. For example, the hardware may include an electrical circuit, an electronic circuit, a processor, a CPU (computer processing unit), a computer, an integrated circuit, integrated circuit cores, a pressure sensor, an inertial sensor, a microelectromechanical system (MEMS), a passive element, or a combination thereof.

Figure 1:
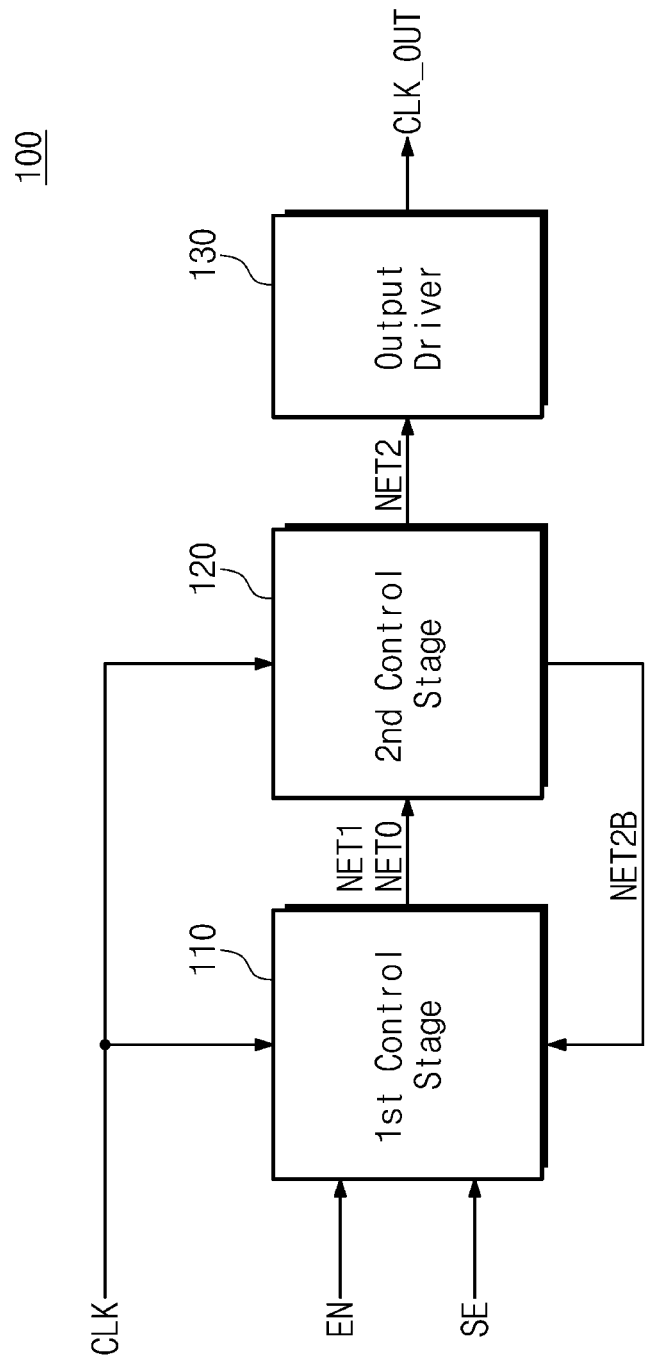
FIG. 1 is a block diagram illustrating an integrated clock gating circuit (ICG) according to an embodiment of the inventive concept.

FIG. 1 is a block diagram illustrating an integrated clock gating circuit (ICG) according to an exemplary embodiment of the inventive concept. In an exemplary embodiment, an ICG 100 may be included in a central processing unit (CPU), an application processor (AP), or an integrated circuit configured to perform various functions, and may be configured to provide an output clock signal CLK_OUT to various function blocks.

Referring to FIG. 1, the ICG 100 may include a first control stage 110, a second control stage 120, and an output driver 130. The first control stage 110 may be configured to output 0-th internal signal NET0 and first internal signal NET1 based on a clock enable signal EN, a test enable signal SE, an inverted second internal signal NET2B, and a clock signal CLK. The second control stage 120 may be configured to output a second internal signal NET2 based on the 0-th and first internal signals NET0 and NET1 and the clock signal CLK. The output driver 130 may output the output clock signal CLK_OUT based on the second internal signal NET2. A configuration of blocks included in the ICG 100 will be more fully described with reference to FIGS. 2A and 2B.

As described above, the ICG 100 may be configured to output the output clock signal CLK_OUT by gating the clock signal CLK based on the clock enable signal EN or the test enable signal SE. In an exemplary embodiment illustrated in FIG. 1 the ICG 100 receives the clock enable signal EN and the test enable signal SE, that is, the ICG 100 receives two enable signals. However, the disclosure is not limited to two enable signals and the number of enable signals may be variously changed.

Figure 2A:
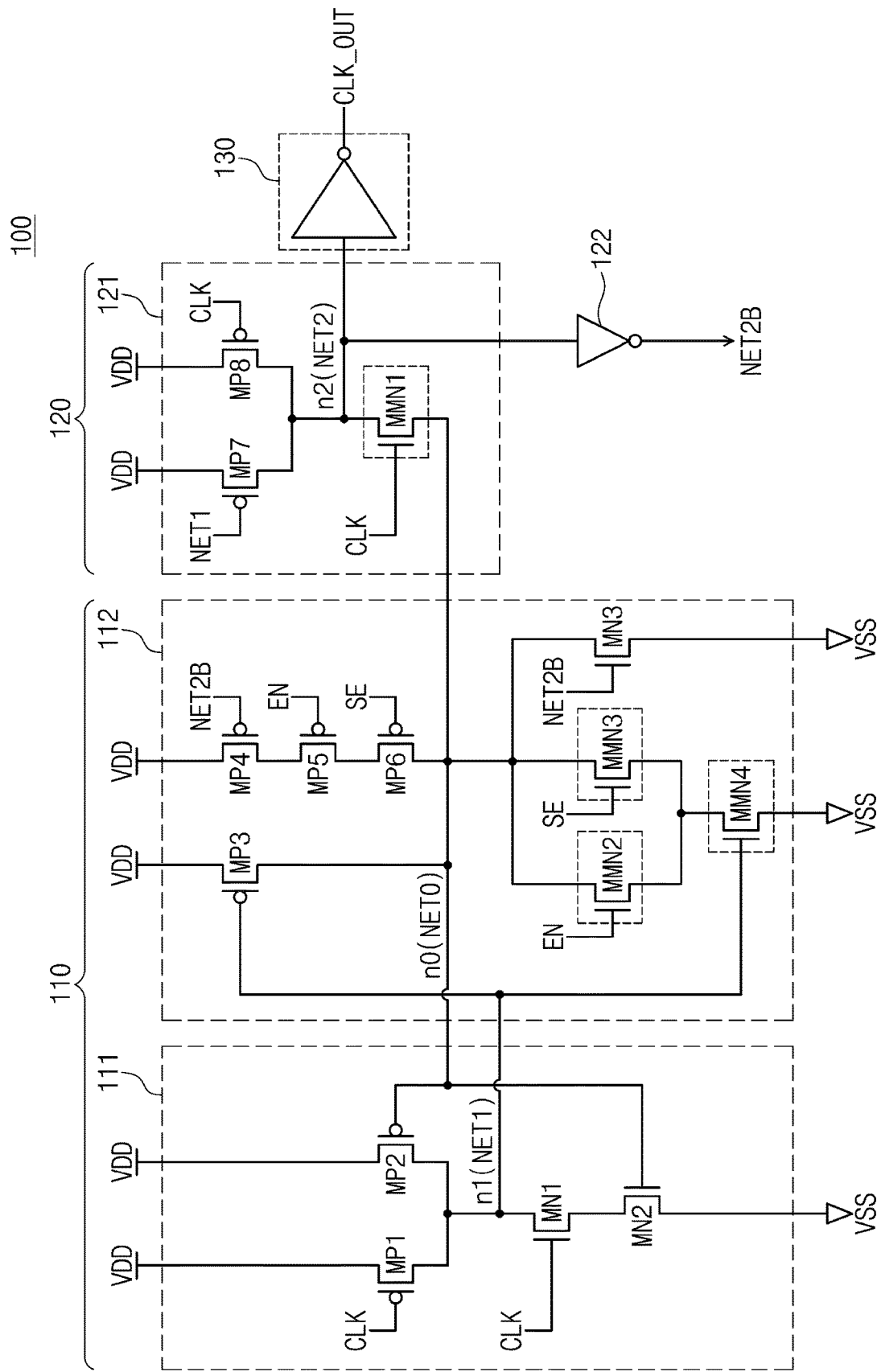
FIG. 2A is a circuit diagram for describing an ICG of FIG. 1.
Figure 2B:
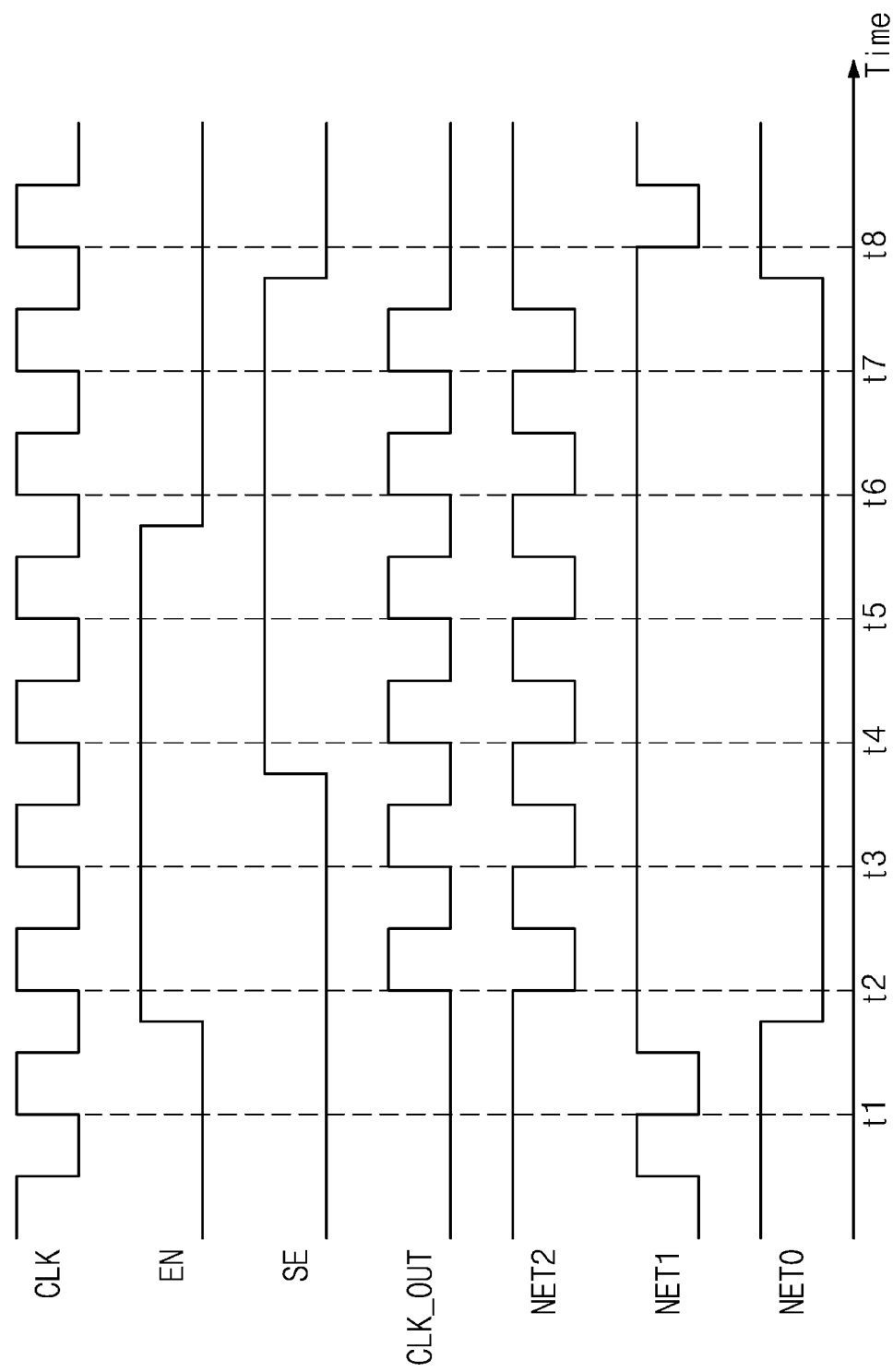
FIG. 2B is a timing diagram for describing an ICG of FIG. 1.

FIGS. 2A and 2B are a circuit diagram and a timing diagram for describing an ICG of FIG. 1. Referring to FIGS. 1, 2A, and 2B, the ICG 100 may include the first control stage 110, the second control stage 120, and the output driver 130. The first control stage 110 may include a clock signal control circuit 111 and an enable signal control circuit 112. The second control stage 120 may include an output control circuit 121 and a feedback inverter 122.

The clock signal control circuit 111 may output the first internal signal NET1 through a first node n1 based on the clock signal CLK and a level of an 0-th node n0, that is, the 0-th internal signal NET0. For example, the clock signal control circuit 111 may include first and second PMOS transistors MP1 and MP2 and first and second NMOS transistors MN1 and MN2.

The first PMOS transistor MP1 may be connected between a power node VDD and the first node n1 and may operate based on the clock signal CLK. The second PMOS transistor MP2 may be connected between the power node VDD and the first node n1 and may operate based on the 0-th internal signal NET0 of the 0-th node n0.

The first and second NMOS transistors MN1 and MN2 may be connected in series between the first node n1 and a ground node VSS. The first NMOS transistor MN1 may operate based on the clock signal CLK, and the second NMOS transistor MN2 may operate based on the 0-th internal signal NET0 of the 0-th node n0.

The enable signal control circuit 112 may be configured to control the level of the 0-th node n0, that is, the 0-th internal signal NET0 based on the enable signals EN and SE, the first internal signal NET1, and the inverted second internal signal NET2B. For example, the enable signal control circuit 112 may include a third PMOS transistor MP3, a fourth PMOS transistor MP4, a fifth PMOS transistor MP5, a sixth PMOS transistor MP6, a third NMOS transistor MN3, a second transistor MMN2, a third transistor MMN3 and a fourth transistor MMN4.

The third PMOS transistor MP3 may be connected between the power node VDD and the 0-th node n0 and may operate based on the first internal signal NET1. The fourth to sixth PMOS transistors MP4 to MP6 may be connected in series between the power node VDD and the 0-th node n0. The fourth PMOS transistor MP4 may operate based on the inverted second internal signal NET2B, the fifth PMOS transistor MP5 may operate based on the clock enable signal EN, and the sixth PMOS transistor MP6 may operate based on the test enable signal SE. The third NMOS transistor MN3 may be connected between the 0-th node n0 and the ground node VSS and may operate based on the inverted second internal signal NET2B.

The second and third transistors MMN2 and MMN3 may be connected in parallel between the 0-th node n0 and a first end of the fourth transistor MMN4, and a second end of the fourth transistor MMN4 may be connected with the ground node VSS. The second transistor MMN2 may operate based on the clock enable signal EN, the third transistor MMN3 may operate based on the test enable signal SE, and the fourth transistor MMN4 may operate based on the first internal signal NET1.

The output control circuit 121 may be configured to output the second internal signal NET2 based on the first internal signal NET1 and the clock signal CLK. For example, the output control circuit 121 may include a seventh PMOS transistor MP7 and eighth PMOS transistor MP8 and a first transistor MMN1. The seventh and eighth PMOS transistors MP7 and MP8 may be connected in parallel between the power node VDD and a second node n2. The seventh NMOS transistor MP7 may operate based on the first internal signal NET1, and the eighth PMOS transistor MP8 may operate based on the clock signal CLK. The first transistor MMN1 may be connected between the second node n2 and the 0-th node n0 and may operate based on the clock signal CLK.

The feedback inverter 122 may invert a level of the second node n2, that is, the second internal signal NET2 and may output the inverted second internal signal NET2B. The inverted second internal signal NET2B may be provided to the enable signal control circuit 112. The output driver 130 may be configured to output the output clock signal CLK_OUT based on the second internal signal NET2.

In an exemplary embodiment, the second internal signal NET2 may maintain a high level when the clock signal CLK is at a low level and may maintain a first operation value of the enable signals EN and SE obtained at a rising edge of the clock signal CLK when the clock signal CLK is at the high level. For instance, the second internal signal NET2 may maintain the first operation value of the enable signals EN and SE obtained at the rising edge of the clock signal CLK when the clock signal CLK is at the high level according to a NOR operation, i.e., EN NOR SE. The first internal signal NET1 may maintain the high level when the clock signal CLK is at the low level and may maintain a second operation value of the enable signals EN and SE obtained at the rising edge of the clock signal CLK when the clock signal CLK is at the high level. For instance, the first internal signal NET1 may maintain the second operation value of the enable signals EN and SE obtained at the rising edge of the clock signal CLK when the clock signal CLK is at the high level according to a NOR operation, i.e., EN NOR SE. The 0-th internal signal NET0 provides a function that allows the first and second internal signals NET1 and NET2 to have opposite levels when the clock signal CLK is at the high level.

In detail, as illustrated in FIG. 2B, at the low level of the clock signal CLK, all the first and second internal signals NET1 and NET2 maintain the high level. At a first time t1, all the enable signals EN and SE are at the low level. Accordingly, after the first time t1 and in a high level period of the clock signal CLK, the second internal signal NET2 maintains the high level, and the first internal signal NET1 maintain the low level. At a second time t2 and a third time t3, the clock enable signal EN is at the high level, and the test enable signal SE is at the low level. At a fourth time t4 and a fifth time t5, both the clock enable signal EN and the test enable signal SE are at the high level. At a sixth time t6 and a seventh time t7, the clock enable signal EN is at the low level, and the test enable signal SE is at the high level. Accordingly, after the second time t2 to the seventh time t7 and in a high level period of the clock signal CLK, the second internal signal NET2 maintains the low level, and the first internal signal NET1 maintain the high level. At an eighth time t8, all the enable signals EN and SE are at the low level. Accordingly, after the eighth time t8 and in a high level period of the clock signal CLK, the second internal signal NET2 maintains the high level, and the first internal signal NET1 maintain the low level.

That is, when both the clock enable signal EN and the test enable signal SE are at the low level, the second internal signal NET2 may maintain the high level; when the clock enable signal EN or the test enable signal SE are at the high level, the second internal signal NET2 may be toggled. In contrast, when both the clock enable signal EN and the test enable signal SE are at the low level, the second internal signal NET2 may be toggled; when the clock enable signal EN or the test enable signal SE are at the high level, the second internal signal NET2 may maintain the high level. When both the clock enable signal EN and the test enable signal SE are at the low level, the first internal signal NET1 may maintain the high level; when the clock enable signal EN or the test enable signal SE are at the high level, the first internal signal NET1 may maintain the low level. The output clock signal CLK_OUT may be an inverted version of the second internal signal NET2.

As described above, the ICG 100 may output the output clock signal CLK_OUT in which the clock signal CLK is gated, by gating the clock signal CLK based on the enable signals EN and SE.

In an exemplary embodiment, to implement a high-speed operation of the ICG 100, some transistors may be implemented with a multi-finger transistor. For instance, transistors MMN1 to MMN4 or transistors included in the output driver 130 may be implemented with a multi-finger transistor, and a configuration of some of the transistors will be more fully described with reference to drawings below.

Herein below, a configuration of a layout for a standard cell of the ICG 100 will be described based on the configuration of the ICG 100 described with reference to FIGS. 1 to 3 according to an exemplary embodiment of the inventive concept. However, the inventive concept is not limited thereto. For example, the inventive concept may be applied to various shapes of integrated clock gating circuits or various standard cells configured to perform another function. In an embodiment, a configuration of a high-speed ICG is disclosed in U.S. Pat. No. 10,014,862, which is hereby incorporated by reference. The configuration of the ICG of the inventive concept disclosed in the reference of the inventive concept may be implemented based on a layout or distributed arrangement according to the inventive concept or the layout or distributed arrangement according to the inventive concept may be applied to the configuration of the ICG disclosed in the reference of the inventive concept.

Figure 3:
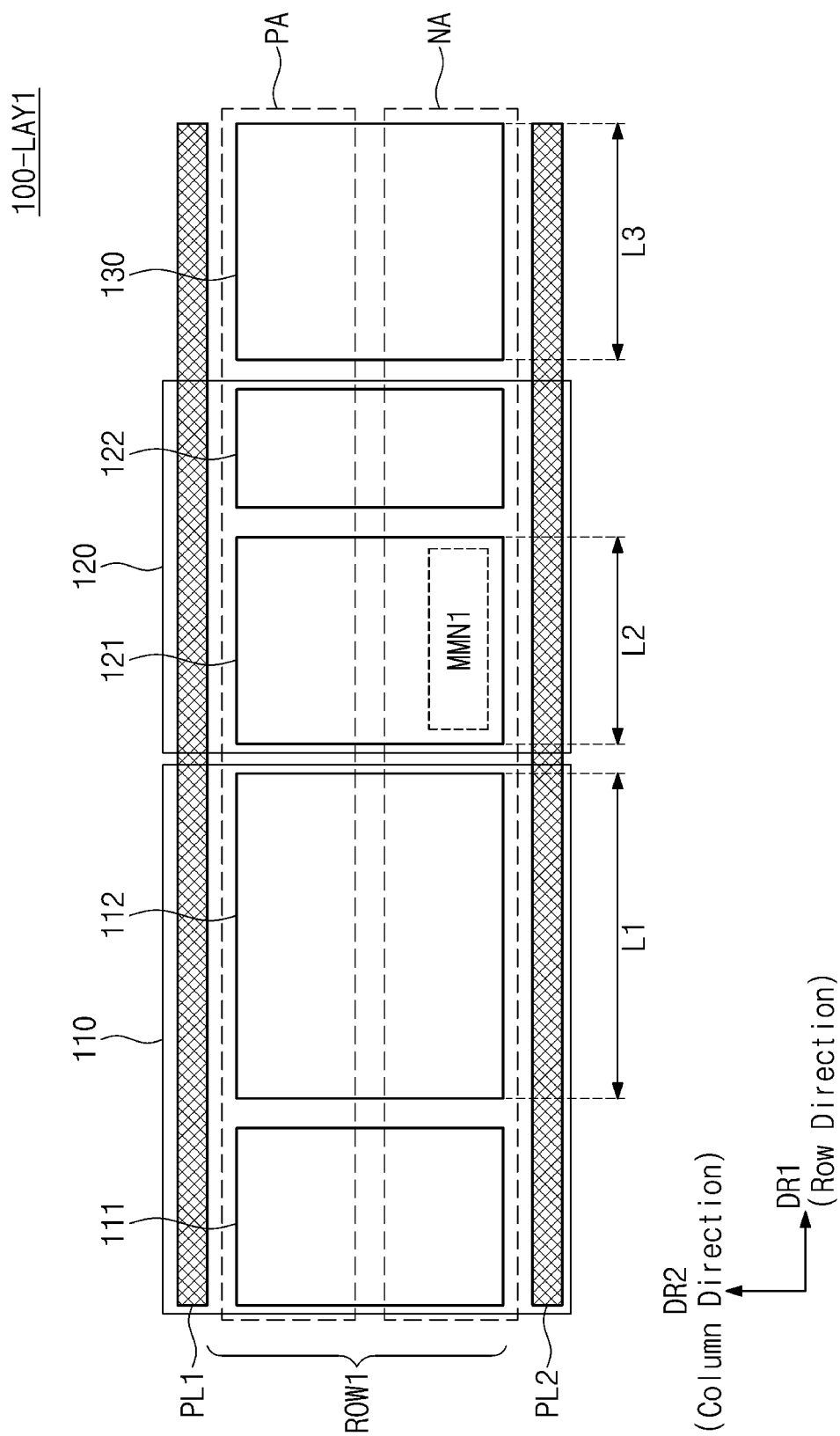
FIG. 3 is a diagram illustrating a layout of an ICG of FIG. 2.
Figure 4A:
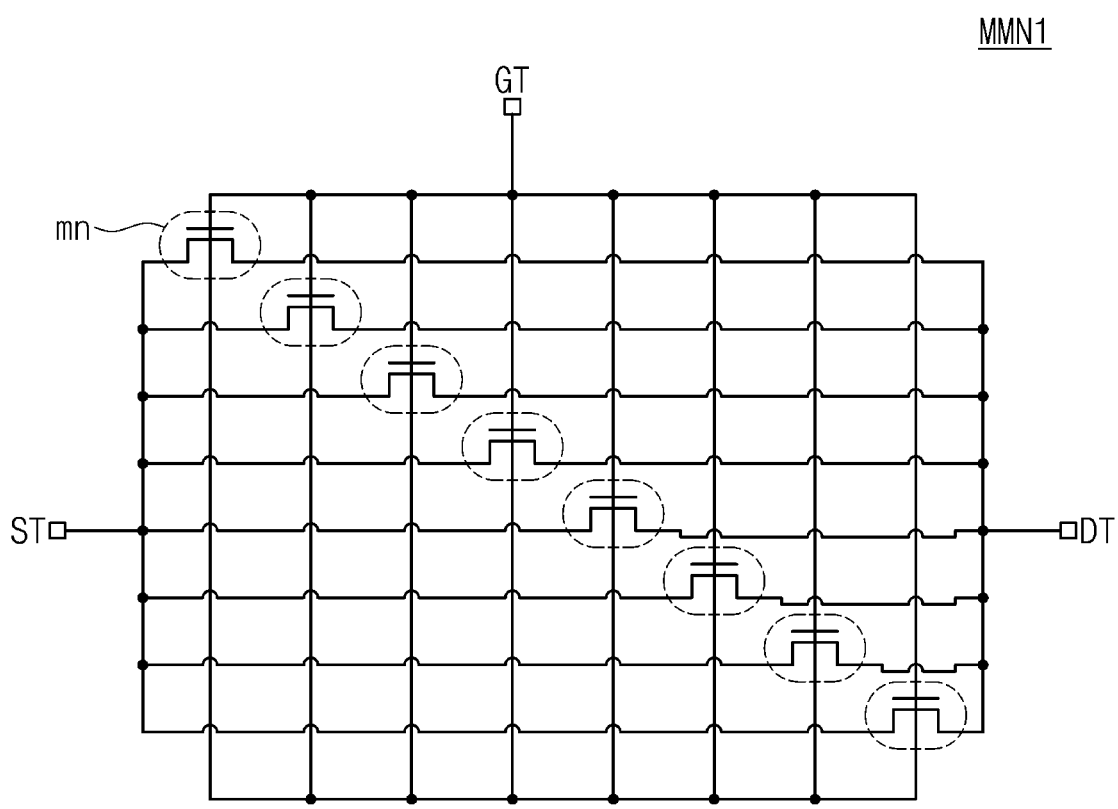
FIGS. 4A and 4B are exemplary diagrams for describing a first transistor of FIG. 3.
Figure 4B:
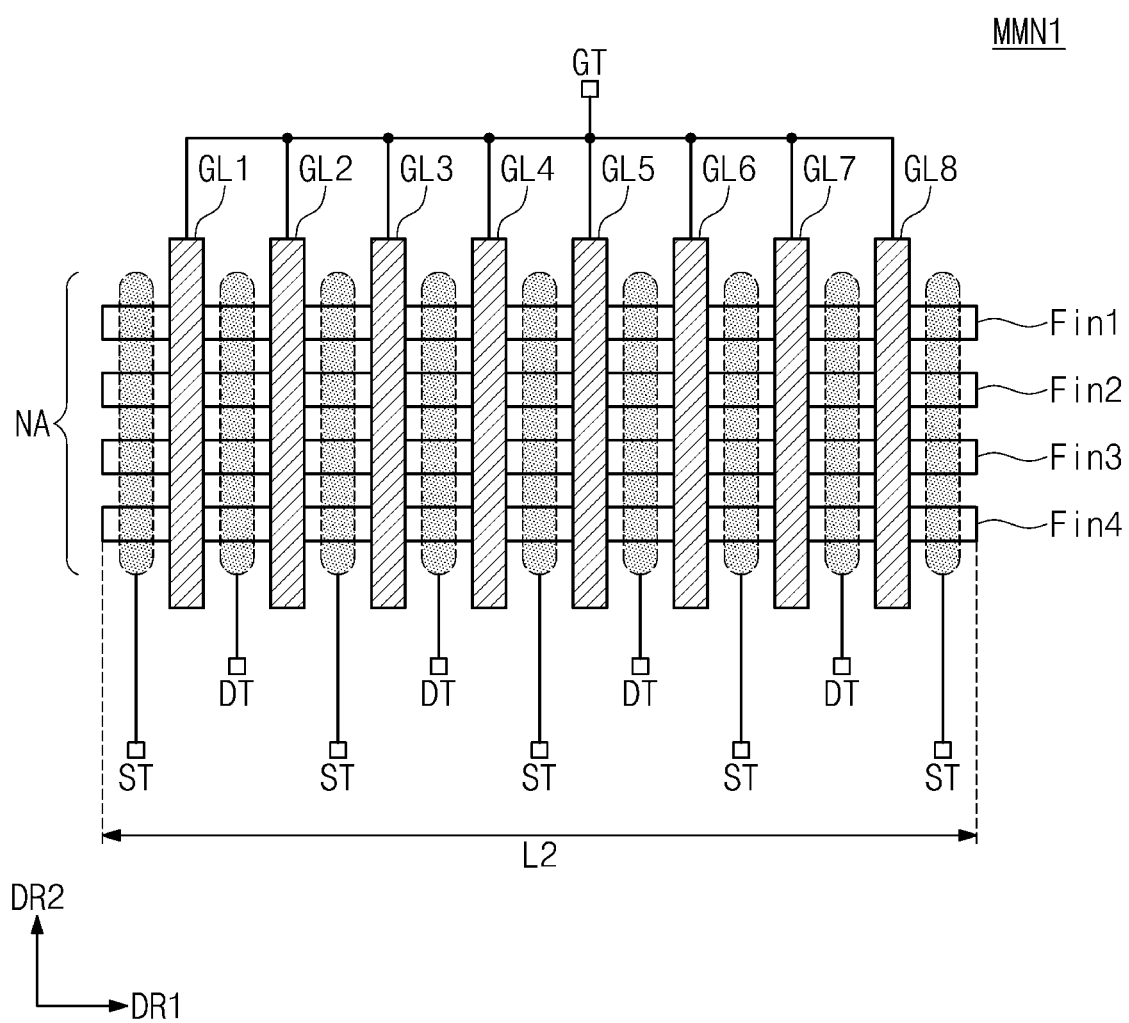

FIG. 3 is a diagram illustrating a layout of an ICG of FIG. 2. FIGS. 4A and 4B are exemplary diagrams for describing a first transistor of FIG. 3. Below, to describe the inventive concept clearly, a brief configuration of various layouts in which the ICG 100 is formed on a semiconductor substrate will be described in units of a block. However, the inventive concept is not limited thereto, and layouts illustrated in drawings may include various semiconductor patterns for forming various elements.

Referring to FIGS. 2 and 3, the ICG 100 may include the first control stage 110, the second control stage 120, and the output driver 130. The first control stage 110 may include the clock signal control circuit 111 and the enable signal control circuit 112. The second control stage 120 may include the output control circuit 121 and the feedback inverter 122.

An ICG layout 100-LAY1 (herein simply referred to as a "layout") for forming the ICG 100 on the semiconductor substrate may be implemented as illustrated in FIG. 3. For example, the first layout 100-LAY1 may be formed by sequentially disposing various circuit blocks 111, 112, 121, 122, and 130 at a first row ROW1 along a first direction DR1 (e.g., a row direction).

The first row ROW1 may indicate a unit area placed between a first power line PL1 and a second power line PL2. For example, the first power line PL1 may be a metal line configured to provide the power supply voltage VDD, and the second power line PL2 may be a metal line configured to provide the ground voltage VSS. That is, the first and second power lines PL1 and PL2 may be extended along the first direction DR1 (or a row direction). That is, one row (e.g., ROW1) may be a unit area defined by two adjacent power lines. In an exemplary embodiment, the first power line PL1 may provide the ground voltage VSS, and the second power line PL2 may provide the power supply voltage VDD.

The first row ROW1 may include a PMOS area PA and an NMOS area NA. The PMOS area PA may indicate an area where PMOS transistors are formed, and the NMOS area NA may indicate an area where NMOS transistors are formed. In an exemplary embodiment, the PMOS area PA may be disposed adjacent to the first power line PL1 through which the power supply voltage VDD is provided, on a plane defined by the first direction DR1 and a second direction DR2. The NMOS area NA may be disposed adjacent to the second power line PL2 through which the ground voltage VSS is provided, on one plane defined by the first direction DR1 and the second direction DR2.

In an exemplary embodiment, each of the circuit blocks 111, 112, 121, 122, and 130 may include the corresponding elements (e.g., transistors) described with reference to FIG. 2A. In this case, the size of each of the circuit blocks 111, 112, 121, 122, and 130 may be decided depending on a characteristic or size of elements or the number of elements. For example, the enable signal control circuit 112 may have a first length L1 along the first direction DR1, the output control circuit 121 may have a second length L2 along the first direction DR1, and the output driver 130 may have a third length L3 along the first direction DR1. Each of the first to third lengths L1 to L3 may be decided depending on a characteristic or size of corresponding elements or the number of corresponding elements.

In an exemplary embodiment, as a high-speed operation of the ICG 100 is required, improvement of a drive strength of elements included in the ICG 100 is required. For example, returning to the circuit diagram of FIG. 2A, to minimize a delay of a rising/falling edge of the output clock signal CLK_OUT, it is necessary to improve the drive strength of the first to fourth transistors MMN1 to MMN4 placed between the second node n2 and the ground node VSS. In addition, for a high-speed operation of the output driver 130, it is necessary to improve the drive strength of transistors included in the output driver 130.

In general, the drive strength of a transistor may be improved by increasing a channel size (or width) of the transistor. However, there is a limitation on an increase in the drive strength of the transistor in a semiconductor process performed depending on a given condition. For example, the drive strength of a fin field-effect (FinFet) transistor may be improved by increasing the number of fins, but it is difficult to increase the number of fins due to the nano-scale manufacturing technology for FinFet. Alternatively, in some processes, the number of fins of a single FinFet transistor is in advance decided, thereby making it difficult to increase the number of fins. To solve this issue, a transistor of a multi-finger structure (hereinafter referred to as a "multi-finger transistor") may be applied.

For example, as illustrated in FIG. 4A, the first transistor MMN1 may be implemented with a multi-finger transistor. For example, the first transistor MMN1 being a multi-finger transistor may be expressed by an equivalent circuit illustrated in FIG. 4A. That is, one first transistor MMN1 may be expressed by a structure in which a plurality of NMOS transistors are connected in parallel between a source terminal ST and a drain terminal DT and share a gate terminal GT.

In detail, as illustrated in FIG. 4B, a plurality of fins Fin1 to Fin4 may be formed in the NMOS area NA along the first direction DR1. The number of fins formed in the NMOS area NA is exemplary, and the inventive concept is not limited thereto. A typical single FinFet transistor may be implemented by forming one gate line on the plurality of fins Fin1 to Fin4, which are formed along the first direction DR1, along the second direction DR2.

However, as described above, the first transistor MMN1 may be implemented with a multi-finger structure to improve the drive strength of the first transistor MMN1. That is, the first transistor MMN1 (or one multi-finger transistor) may be implemented in the NMOS area NA by forming a plurality of gate lines GL1 to GL8, which are extended along the second direction DR2, on the plurality of fins Fin1 to Fin4 formed along the first direction DR1. The plurality of gate lines GL1 to GL8 may share the gate terminal GT. Areas between the gate lines GL1 to GL8 may be connected with the source terminal ST or the drain terminal DT. The number of gate lines illustrated in FIGS. 4A and 4B may be exemplary, and the number of gate lines may vary depending on the drive strength of the first transistor MMN1. For example, as the number of gate lines increases, the drive strength may increase.

As described above, to improve the drive strength of particular elements (e.g., the first to fourth transistors MMN1 to MMN4 or the output driver 130) included in the ICG 100, the particular elements may be implemented with a multi-finger transistor. In this case, a plurality of gate lines GL may be extended along the second direction DR2 and may be disposed along the first direction DR1. That is, as the number of gate lines GL increases, lengths (e.g., L1, L2, and L3) of the circuit blocks (e.g., 112, 121, and 130), which include multi-finger transistors, in the first direction DR1 may increase.

As the lengths (e.g., L1, L2, and L3) of the circuit blocks (e.g., 112, 121, and 130) in the first direction DR1 increase, the total area of the first layout 100-LAY1 may increase. In addition, as the lengths in the first direction DR1 increase, lengths of internal wires configured to provide various signals may increase, thereby causing a signal delay or an increase in power consumption.

To solve the above issues, according to the layout for an ICG of the inventive concept, circuit blocks of the ICG are distributed and arranged through a plurality of rows. A configuration of a layout for an ICG according to the inventive concept will be more fully described with reference to drawings below.

Figure 5A:
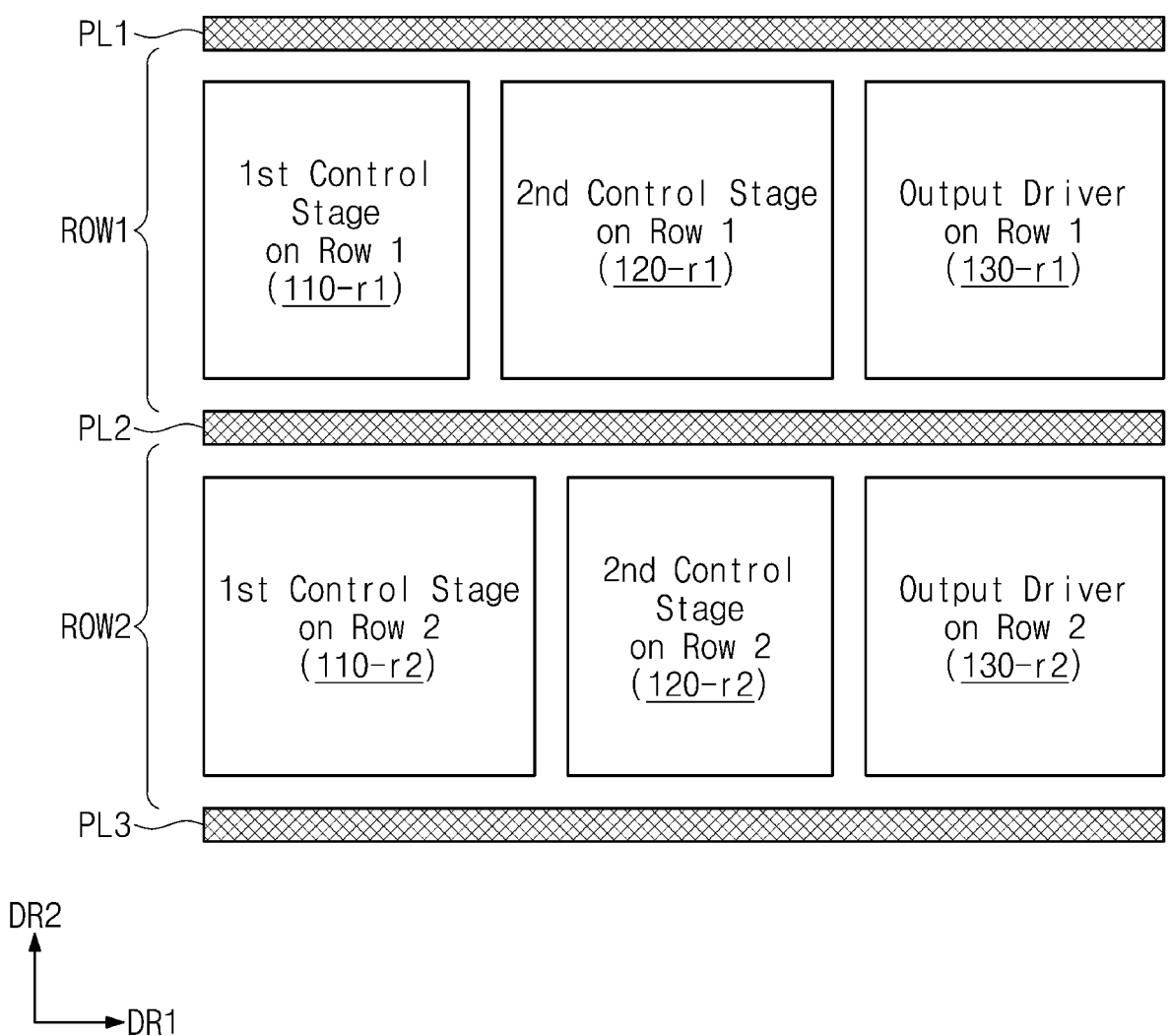
FIGS. 5A and 5B are diagrams illustrating a layout of an ICG according to embodiments of the inventive concept.
Figure 5B:
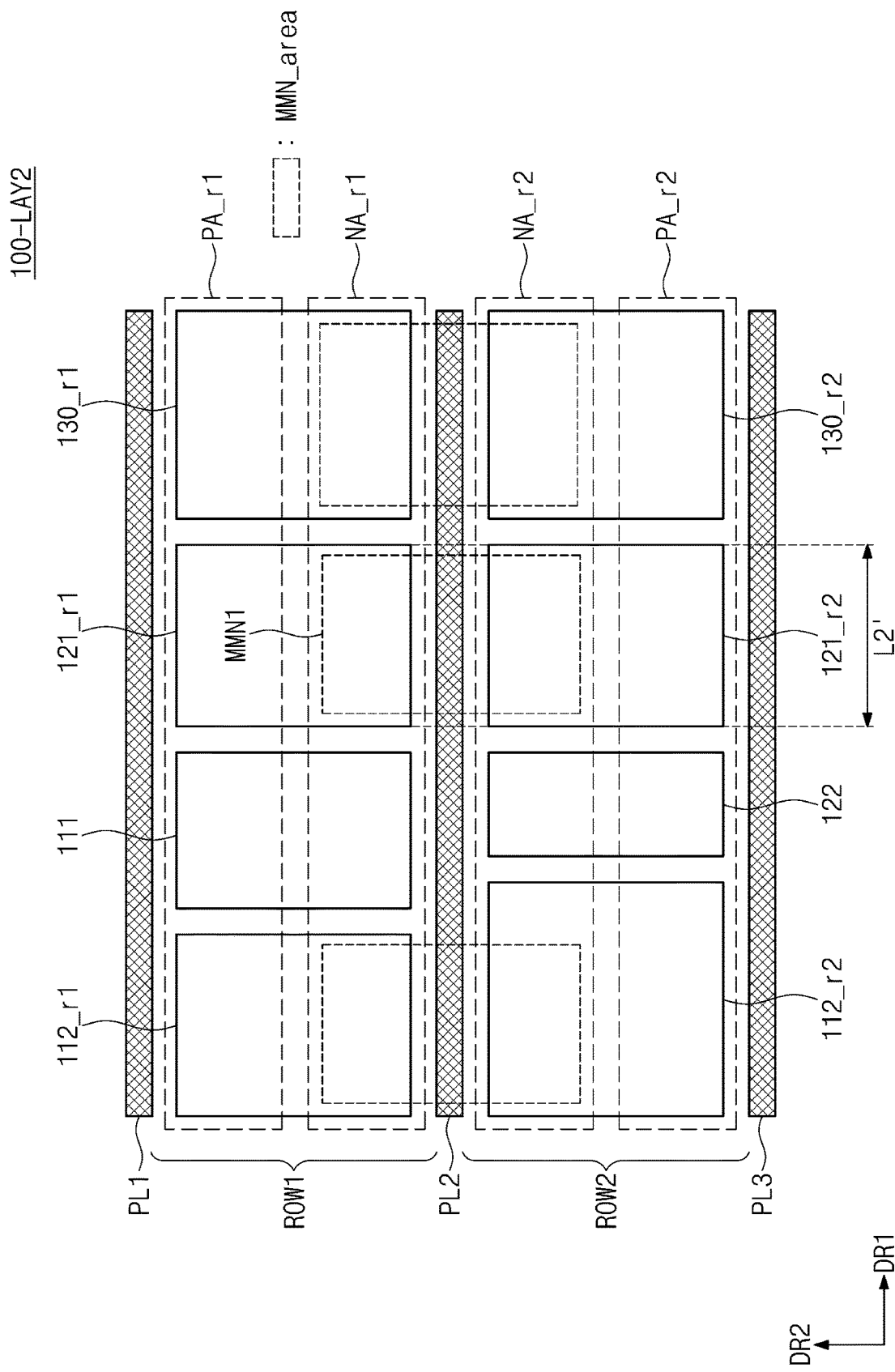

FIGS. 5A and 5B are diagrams illustrating a layout of an ICG according to embodiments of the inventive concept. For convenience of description, with regard to the components described above and components unnecessary to describe the inventive concept, additional description will be omitted to avoid redundancy. Below, it is assumed that the layout for the ICG according to an embodiment of the inventive concept is a FinFet transistor based standard cell layout.

Also, for convenience of description, it is assumed that the number of fins of a single transistor to be formed is in advance decided (e.g., is "4"). That is, the given number of fins may be extended along the first direction DR1 (or a row direction) in a particular area (e.g., a PMOS area or an NMOS area) included in one row. However, the inventive concept is not limited thereto. For example, the number of fins of a unit transistor may be variously changed depending on various manufacturing processes.

Referring to FIGS. 1 and 5A, the ICG 100 may include the first control stage 110 (110-r1 and 110-r2), the second control stage 120 (120-r1 and 120-r2), and the output driver 130 (130-r1 and 130-r2). Unlike the first layout 100-LAY1 of FIG. 3, referring to a second layout 100-LAY2 of FIG. 5A, the first control stage 110, the second control stage 120, and the output driver 130 may be distributed and arranged on first and second rows ROW1 and ROW2.

For example, the first control stage 110 may be divided into a first control stage on ROW1 110-r1 and a first control stage on ROW2 110-r2, the second control stage 120 may be divided into a second control stage on ROW1 120-r1 and a second control stage on ROW2 110-r2, and the output driver 130 may be divided into a first output driver on ROW1 130-r1 and a second output driver on ROW2 130-r2.

According to an exemplary embodiment, the first control stage on ROW1 110-r1, the second control stage on ROW1 120-r1, and the first output driver on ROW1 130-r1 may be sequentially disposed at the first row ROW1 along the first direction DR1. The first control stage on ROW2 110-r2, the second control stage on ROW2 120-r2, and the second output driver on ROW2 130-r2 may be sequentially disposed at the second row ROW2 along the first direction DR1. However, the arrangement or the order of placement of the ROW1 110-r1, the second control stage on ROW1 120-r1, the first output driver on ROW1 130-r1, the ROW2 110-r2, the second control stage on ROW2 120-r2, and the second output driver on ROW2 130-r2 is not limited to the illustrated in FIG. 5A.

The first row ROW1 may indicate a unit area defined by a first power line PL1 and a second power line PL2, and the second row ROW2 may indicate a unit area defined by the second power line PL2 and a third power line PL3. In an exemplary embodiment, the first and third power lines PL1 and PL3 may be metal lines configured to provide the power supply voltage VDD, and the second power line PL2 may be a metal line configured to provide the ground voltage VSS. Alternatively, the first and third power lines PL1 and PL3 may be metal lines configured to provide the ground voltage VSS, and the second power line PL2 may be a metal line configured to provide the power supply voltage VDD. Below, for convenience of description, it is assumed that the first and third power lines PL1 and PL3 provide the power supply voltage VDD and the second power line PL2 provided the ground voltage VSS. However, the voltages of the power line PL1, PL2 and PL3 are not limited thereto, and thus according to another exemplary embodiment, the voltages of the power lines PL1, PL2 and PL3 may be different.

As described above, by distributing and arranging each of the circuit blocks 110, 120, and 130 of the ICG 100 at the first and second rows ROW1 and ROW2, a layout of the second layout 100-LAY2 in the first direction DR1 may be decreased compared with the first layout 100-LAY1 of FIG. 3.

In detail, referring to FIGS. 2A, 5A, and 5B, the first control stage on ROW1 110_r1 may include a first enable signal control circuit 112_r1 and the clock signal control circuit 111. The second control stage on ROW1 120_r1 may include a first output control circuit 121_r1. The first control stage on ROW2 110_r2 may include a second enable signal control circuit 112_r2. The second control stage on ROW2 120_r2 may include a second output control circuit 121_r2 and the feedback inverter 122.

The first enable signal control circuit 112_r1, the clock signal control circuit 111, the first output control circuit 121_r1, and a first output driver circuit 130_r1 may be sequentially disposed at the first row ROW1 along the first direction DR1. The second enable signal control circuit 112_r2, the feedback inverter 122, the second output control circuit 121_r2, and a second output driver circuit 130_r2 may be sequentially disposed at the second row ROW2 along the first direction DR1.

In an exemplary embodiment, as described above, the first to fourth transistors MMN1 to MMN4 and the output driver 130 may be implemented with a multi-finger transistor. In this case, elements implemented with a multi-finger transistor may be distributed and arranged at a first NMOS area NA_r1 and a second NMOS area NA_r2. Alternatively, elements implemented with a multi-finger transistor may share the first NMOS area NA_r1 and the second NMOS area NA_r2. Alternatively, one multi-finger transistor may be implemented through the first NMOS area NA_r1 and the second NMOS area NA_r2.

For example, the output control circuit 121 may include the first transistor MMN1. The output control circuit 121 may be divided into the first output control circuit 121_r1 and the second output control circuit 121_r2. In this case, a portion of the first transistor MMN1 may be included in the first output control circuit 121_r1, and the remaining portion of the first transistor MMN1 may be included in the second output control circuit 121_r2. In this case, the number of gate lines connected with the first transistor MMN1 may be decreased in a state where the drive strength of the first transistor MMN1 is maintained. As the number of gate lines connected with the first transistor MMN1 is decreased, a length (e.g., L2') of the output control circuits 121_r1 and 121_r2 may be decreased. A configuration in which a multi-finger transistor is distributed and arranged at the first row ROW1 and the second row ROW2 will be more fully described with reference to drawings below.

In an exemplary embodiment, the enable signal control circuit 112, the output control circuit 121, and the output driver 130 including multi-finger transistors may be distributed and arranged at the first row ROW1 and the second row ROW2 so as to at least partially overlap each other in a column direction corresponding to the second direction DR2. For example, the first enable signal control circuit 112_r1 and the second enable signal control circuit 112_r2 may at least partially overlap each other along the second direction DR2. An area where the NMOS area NA_r1 of the first enable signal control circuit 112_r1 and the NMOS area NA_r2 of the second enable signal control circuit 112_r2 at least partially overlap each other along the second direction DR2 may be a multi-finger transistor area MMN_area where a multi-finger transistor is formed. Likewise, an area where the NMOS area NA_r1 of the first output control circuit 121_r1 and the NMOS area NA_r2 of the second output control circuit 121_r2 at least partially overlap each other along the second direction DR2 and an area where the NMOS area NA_r1 of the first output driver circuit 130_r1 and the NMOS area 112_r2 of the second output driver circuit 130_r2 at least partially overlap each other along the second direction DR2 may be a multi-finger transistor area MMN_area where a multi-finger transistor is formed. In other words, circuit blocks including a multi-finger transistor may be distributed and arranged at the first row ROW1 and the second row ROW2 so as to at least partially overlap each other along the second direction DR2.

In an exemplary embodiment, the plurality of PMOS transistors MP1 to MP8 included in the ICG 100 may be disposed at a first PMOS area PA_r1 or a second PMOS area PA_r2 of the corresponding circuit blocks 111, 112, 121, 122 and 130.

Figure 6:
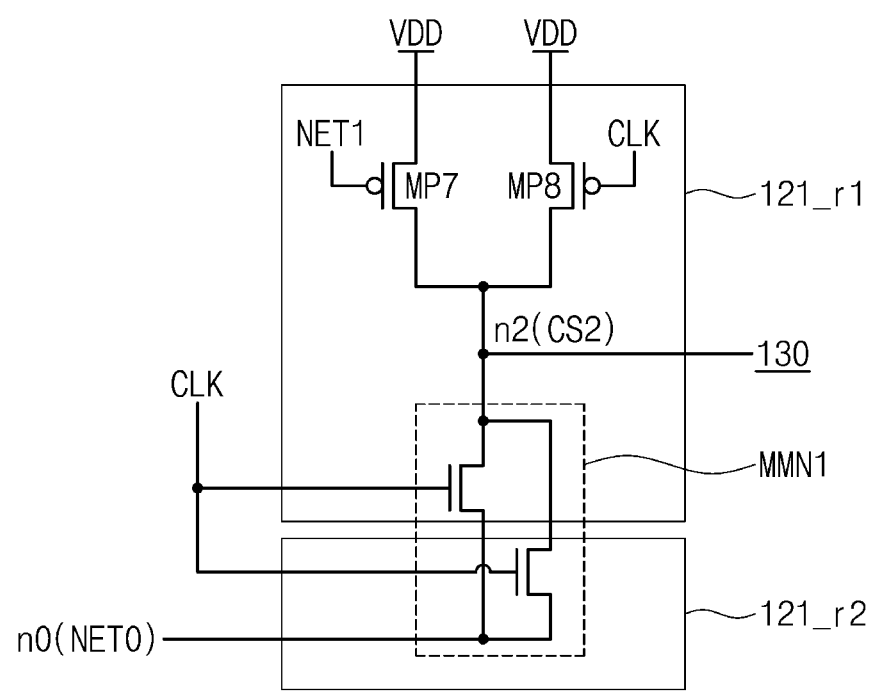
FIG. 6 is a circuit diagram illustrating output control circuits of FIG. 5B.

FIG. 6 is a circuit diagram illustrating output control circuits of FIG. 5B. For convenience of description, additional description associated with the above components will be omitted to avoid redundancy. Referring to FIGS. 5B and 6, the output control circuit 121 may include the seventh and eighth PMOS transistors MP7 and MP8 and the first transistor MMN1. A function and a connection relationship of the seventh and eighth PMOS transistors MP7 and MP8 and the first transistor MMN1 are described with reference to FIG. 2A, and thus, additional description will be omitted to avoid redundancy.

As illustrated in FIG. 6, a portion of the first transistor MMN1 and the seventh and eighth PMOS transistors MP7 and MP8 may be included in the first output control circuit 121_r1, and the remaining portion of the first transistor MMN1 may be included in the second output control circuit 121_r2. For example, as described above, the first transistor MMN1 may be a multi-finger transistor. In this case, the portion of the first transistor MMN1 may be included in the first output control circuit 121_r1, and the remaining portion of the first transistor MMN1 may be included in the second output control circuit 121_r2. That is, the first transistor MMN1 may be distributed and arranged at the first output control circuit 121_r1 and the second output control circuit 121_r2.

An example is illustrated in FIG. 6 as the first transistor MMN1 is formed in the shape of a circuit where two transistors are connected in parallel, and this is for simply describing a multi-finger transistor distributed and arranged at different rows. However, the inventive concept is not limited thereto. That is, the first transistor MMN1 may be implemented with one multi-finger transistor.

In an exemplary embodiment, the seventh and eighth transistors MP7 and MP8 may be formed at the PMOS area PA_r1 of the first output control circuit 121_r1. Alternatively, at least one of the seventh and eighth transistors MP7 and MP8 may be formed at the PMOS area PA_r2 of the second output control circuit 121_r2.

Figure 7A:
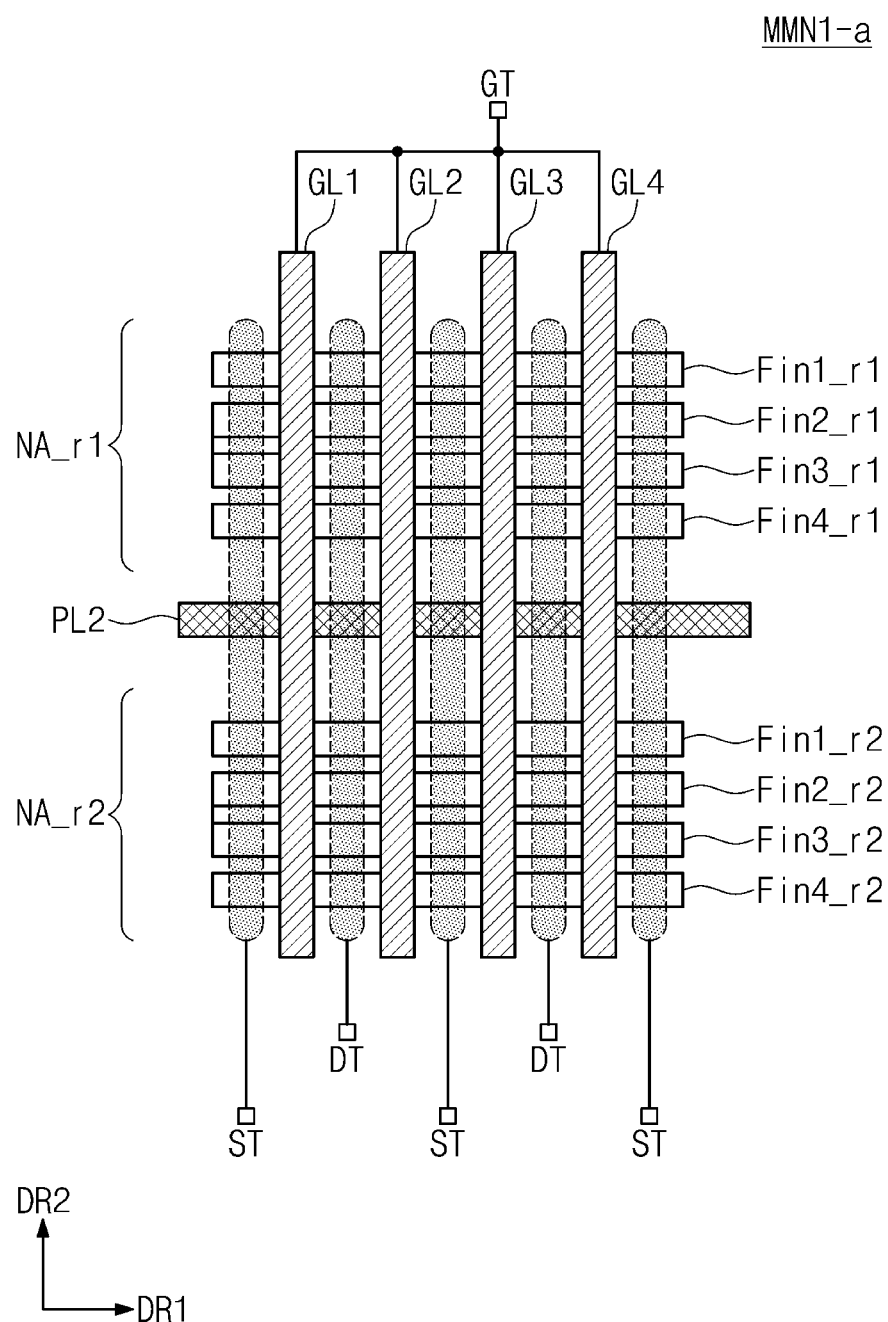
FIGS. 7A to 7C are plan views illustrating an exemplary structure of a first transistor distributed and arranged at first and second rows of FIG. 6.
Figure 7B:
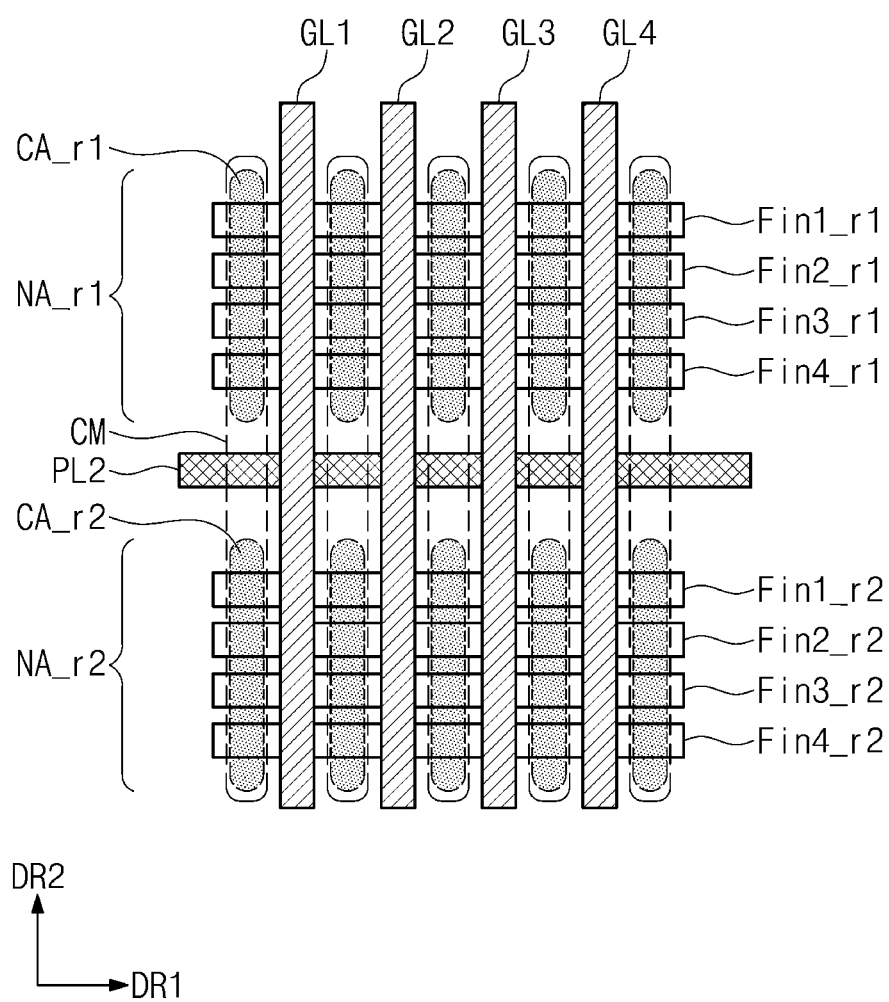
Figure 7C:
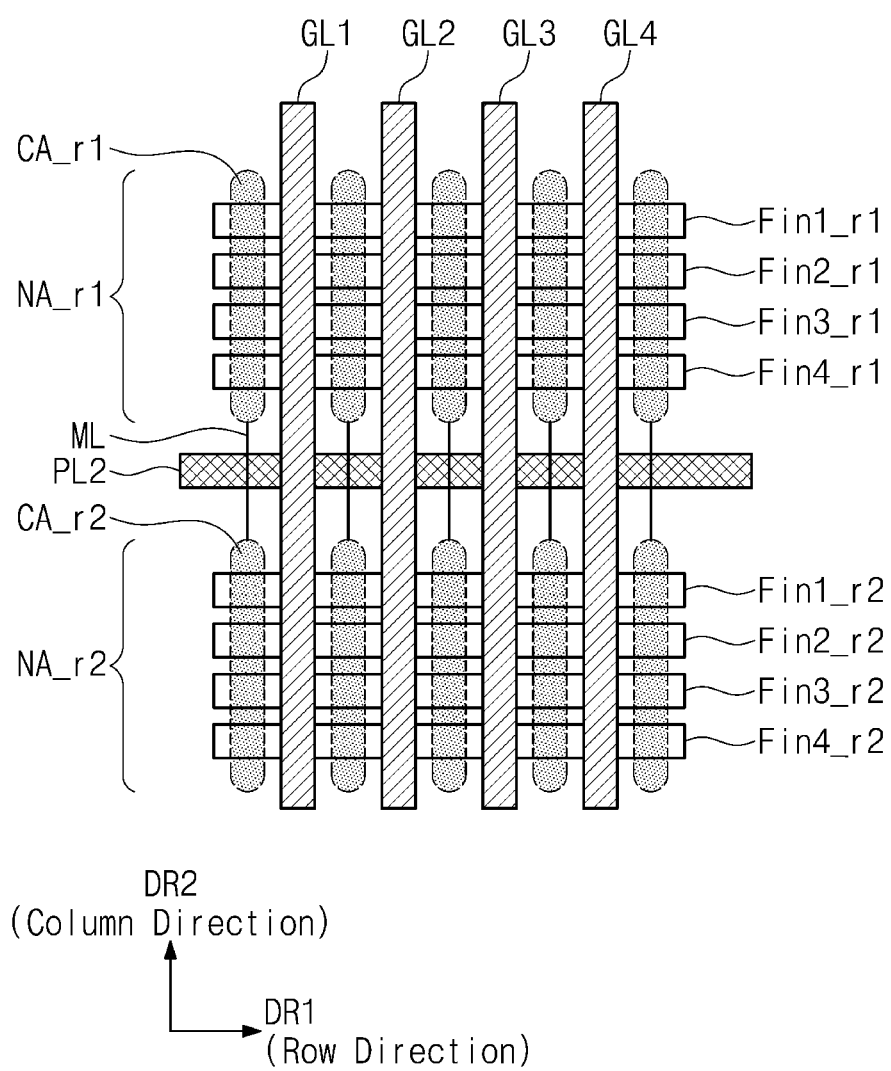

FIGS. 7A to 7C are plan views illustrating an exemplary structure of a first transistor distributed and arranged at first and second rows of FIG. 6. For convenience of description, additional description associated with the above components will be omitted to avoid redundancy. Also, to prevent the inventive concept from being ambiguous, components that are unnecessary to describe a distribution arrangement structure of a first transistor according to the inventive concept are omitted.

Referring to FIGS. 5B, 6, 7A, 7B and 7C, a first transistor MMN1-a may be distributed and arranged at the first NMOS area NA_r1 and the second NMOS area NA_r2. For example, a plurality of fins Fin1_r1 to Fin4_r1 may be formed in the NMOS area NA_r1 along the first direction DR1. A plurality of fins Fin1_r2 to Fin4_r2 may be formed in the NMOS area NA_r2 along the first direction DR1. As described above, the first NMOS area NA_r1 and the second NMOS area NA_r2 may be divided by the second power line PL2.

A plurality of gate lines GL1 to GL4 may be extended along the second direction DR2, on the first NMOS area NA_r1 and the second NMOS area NA_r2. The plurality of gate lines GL1 to GL4 may be interconnected through a common gate terminal GT. Active contacts may be formed along the second direction DR2, in areas on opposite sides of the plurality of gate lines GL1 to GL4 and areas between the plurality of gate lines GL1 to GL4. The active contacts may be connected with the source terminals ST and the drain terminals DT. In an exemplary embodiment, the source terminal ST may be connected with the 0-th node n0, the drain terminal DT may be connected with the second node n2, and the common gate terminal GT may receive the clock signal CLK.

That is, as illustrated in FIG. 7A, the first transistor MMN1-a may be formed at the first NMOS area NA_r1 and the second NMOS area NA_r2. The gate lines GL1 to GL4 of the first transistor MMN1-a may be connected with the plurality of fins Fin1_r1 to Fin4_r1 of the first NMOS area NA_r1 and the plurality of fins Fin1_r2 to Fin4_r2 of the second NMOS area NA_r2. That is, the first NMOS area NA_r1 and the second NMOS area NA_r2, in which the first transistor MMN1 is formed, may share the gate lines GL1 to GL4.

In an exemplary embodiment, the first transistor MMN1-a of FIG. 7A may have the same drive strength as the first transistor MMN1 of FIG. 4B. However, the first transistor MMN1 of FIG. 4B requires 8 gate lines GL1 to GL8, and the first transistor MMN1-a according to an embodiment of the inventive concept illustrated in FIG. 7B requires only 4 gate lines GL1 to GL4. That is, because the number of gate lines required to implement the same drive strength is decreased, there may be decreased a length in the first direction DR1, which is required to implement a multi-finger transistor. In this case, as described above, an internal wire for a signal transfer may be simplified. This may mean that a signal delay is decreased and power consumption is decreased.

According to an exemplary embodiment illustrated in FIGS. 7A and 7B, a method of connecting active contacts CA_r1 of a first row and active contacts CA_r2 of a second row will be described. For example, as described with reference to FIG. 7A, active contacts, which are placed at the same column (e.g., the second direction DR2), from among the active contacts CA_r1 and CA_r2 of the first NMOS area NA_r1 and the second NMOS area NA_r2 are electrically interconnected.

In this case, as illustrated in FIG. 7B, the active contacts CA_r1 and CA_r2 placed at the same column of a first transistor MMN1-b may be electrically interconnected through an intermediate contact CM. In an exemplary embodiment, the intermediate contact CM may be formed prior to a metal layer forming various wires in an integrated circuit in which the ICG 100 is included. That is, the intermediate contact CM may be formed to be closer to a substrate than the metal wires.

Alternatively, as illustrated in FIG. 7C, the active contacts CA_r1 and CA_r2 placed at the same column of a first transistor MMN1-c may be electrically interconnected through a metal wire ML. In an exemplary embodiment, the metal wire ML may be formed at a metal layer in which there are formed various wires in an integrated circuit in which the ICG 100 is included.

In the above embodiment, to describe the inventive concept easily, a layout of the first transistor MMN1, in which a multi-finger transistor is distributed and arranged at different rows is described, but the inventive concept is not limited thereto. For example, as described with reference to FIG. 2A, a plurality of transistors (e.g., MMN1 to MMN4) or the output driver 130 included in the ICG 100 may be implemented with multi-finger transistors, and each of the multi-finger transistors may be distributed and arranged at different rows as described with reference to FIGS. 5A, 5B, 6, 7A, 7B and 7C. In this case, because the number of gate lines is decreased in a state where the drive strength of a transistor is maintained, a signal wire may be simplified. This may mean that power consumption and a signal delay are decreased.

Figure 8B:
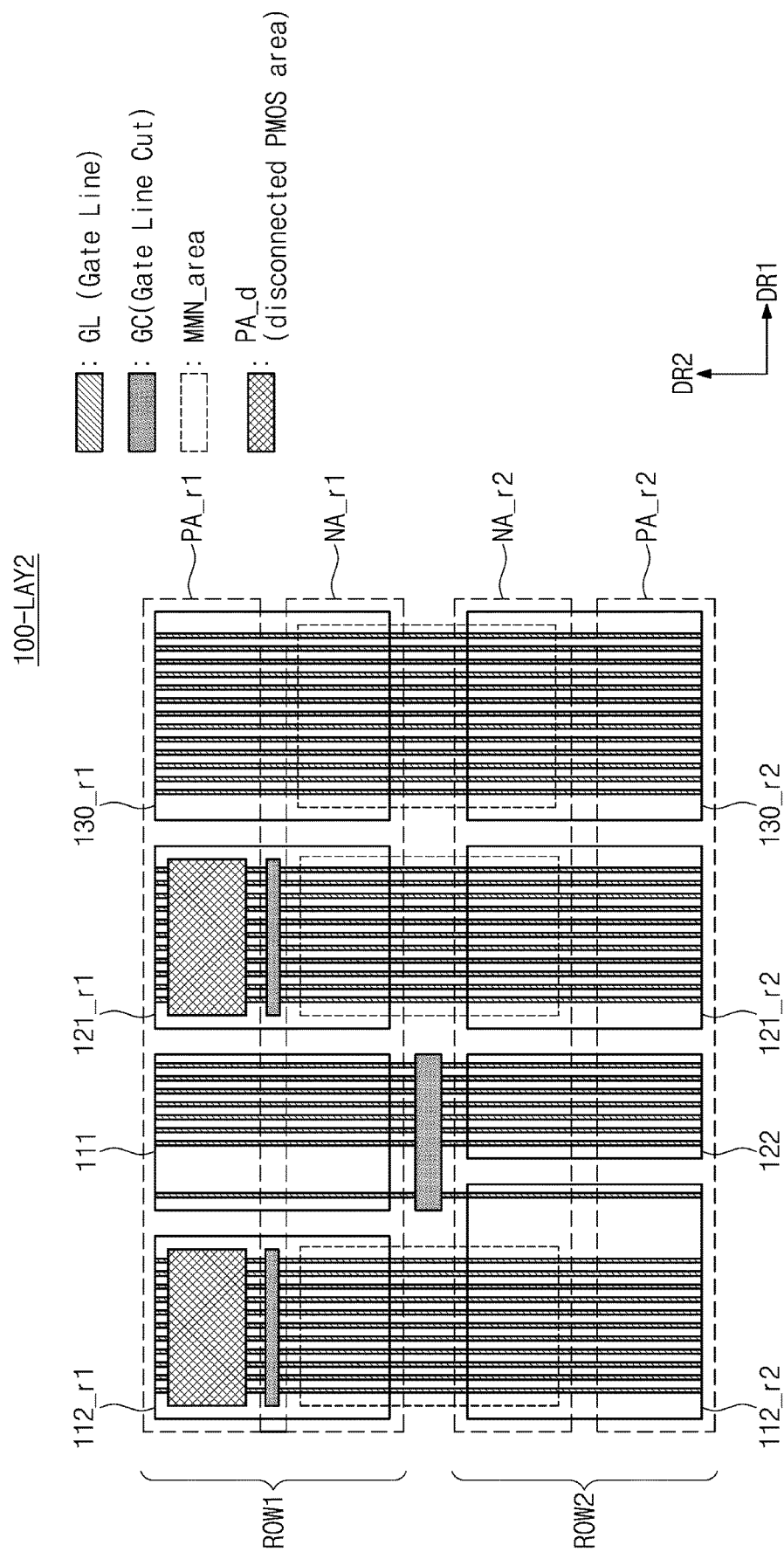
Figure 8C:
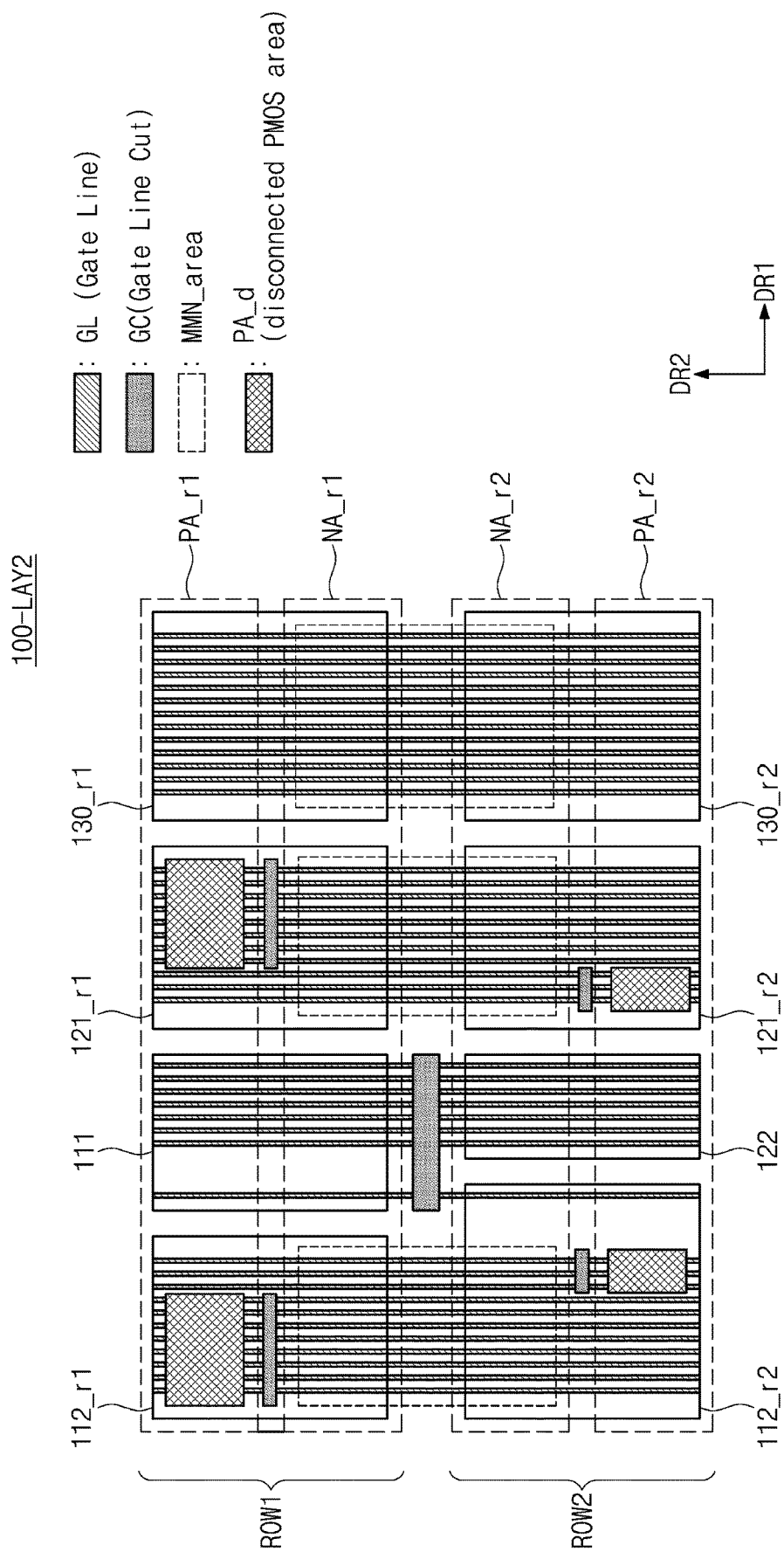

FIGS. 8A to 8C are diagrams illustrating a second layout of FIG. 5B. For brevity of illustration, the first to third power lines PL1 to PL3 are omitted in FIGS. 8A to 8C. For convenience of description, additional description associated with the above components will be omitted to avoid redundancy.

Referring to FIGS. 5B, 6, 8A, 8B and to 8C, according to the second layout 100-LAY2 for the ICG 100, the first enable signal control circuit 112_r1, the clock signal control circuit 111, the first output control circuit 121_r1, and the first output driver circuit 130_r1 may be sequentially disposed at the first row ROW1 along the first direction DR1. The second enable signal control circuit 112_r2, the feedback inverter 122, the second output control circuit 121_r2, and the second output driver circuit 130_r2 may be sequentially disposed at the second row ROW2 along the first direction DR1.

A plurality of fins may be formed along the first direction DR1 at the first PMOS area PA_r1 and the first NMOS area NA_r1 of the first row ROW1 and the second PMOS area PA_r2 and the second NMOS area NA_r2 of the second row ROW2. The plurality of gate lines GL may be extended along the second direction DR2. Various transistors may be implemented by the plurality of gate lines GL and the plurality of fins.

As described above, the first and second enable signal control circuits 112_r1 and 112_r2 may include multi-finger transistors (e.g., MMN2 to MMN4). As described above, the multi-finger transistors may be distributed and arranged at the multi-finger transistor area MMN_area. That is, the gate lines GL formed on an area where the first and second enable signal control circuits 112_r1 and 112_r2 are disposed may be extended along the second direction DR2 at the first row ROW1 and the second row ROW2. In other words, the first and second enable signal control circuits 112_r1 and 112_r2 respectively disposed at the first and second rows ROW1 and ROW2 may share the same gate lines GL. In detail, the first and second enable signal control circuits 112_r1 and 112_r2 may share at least one gate line to which the clock enable signal EN is provided, at least one gate line to which the test enable signal SE is provided, or at least one gate line to which the first internal signal NET1 is provided.

Likewise, the first and second output control circuits 121_r1 and 121_r2 and the first and second output driver circuits 130_r1 and 130_r2 may include multi-finger transistors. As described above, the multi-finger transistors may be distributed and arranged at the multi-finger transistor area MMN_area, the first and second output control circuits 121_r1 and 121_r2 may share gate lines GL extended in the second direction DR2, and the first and second output driver circuits 130_r1 and 130_r2 may share gate lines GL extended in the second direction DR2. In detail, the first and second output control circuits 121_r1 and 121_r2 may share at least one gate line to which the clock signal CLK is provided. The first and second output driver circuits 130_r1 and 130_r2 may share at least one gate line to which the second internal signal NET2 is provided.

In an exemplary embodiment, at least a portion of the clock signal control circuit 111 and at least a portion of the feedback inverter 122 may overlap each other at the same column. A signal applied to a gate of a transistor of the clock signal control circuit 111 may be different from a signal applied to a gate of a transistor of the feedback inverter 122. As such, as illustrated in FIG. 8A, a gate line cut GLC for separating gate lines of the clock signal control circuit 111 from gate lines of the feedback inverter 122 may be disposed between the clock signal control circuit 111 and the feedback inverter 122. The gate lines of the clock signal control circuit 111 and the gate lines of the feedback inverter 122 may be separated by the gate line cut GLC.

In an exemplary embodiment, some transistors of a particular circuit block may be formed at the first row ROW1 or the second row ROW2. For example, the third to sixth PMOS transistors MP3 to MP6 included in the enable signal control circuit 112 may be included in the second enable signal control circuit 112_r2 placed at the second row ROW2. In this case, as illustrated in FIG. 8B, a gate signal to be applied to transistors formed at the first PMOS area PA_r1 of the first enable signal control circuit 112_r1 may be blocked by disposing a gate line cut GLC between the first PMOS area PA_r1 and the first NMOS area NA_r1 of the first enable signal control circuit 112_r1. That is, a PMOS area PA_d that is not connected with a gate line by the gate line cut GLC may be formed between the first PMOS area PA_r1 and the first NMOS area NA_r1 of the first enable signal control circuit 112_r1. A configuration where the gate line cut GLC is formed at the first output control circuit 121_r1 of FIG. 8B is similar to the configuration described above, and thus, additional description will be omitted to avoid redundancy.

In an exemplary embodiment, one or more transistors of the third to sixth PMOS transistors MP3 to MP6 included in the enable signal control circuit 112 may be formed at the first row ROW1, and the remaining transistor(s) thereof may be formed at the second row ROW2. In this case, as illustrated in FIG. 8C, gate line cuts GLC may be disposed between the first PMOS area PA_r1 and the first NMOS area NA_r1 of the first enable signal control circuit 112_r1 and between the second PMOS area PA_r2 and the second NMOS area NA_r2 of the second enable signal control circuit 112_r2 such that gate lines being not shared are separated from each other. A configuration where the gate line cuts GLC are formed at the first output control circuit 121_r1 and the second output control circuit 121_r2 of FIG. 8C is similar to the configuration described above, and thus, additional description will be omitted to avoid redundancy.

In an exemplary embodiment, the arrangement of the gate line cuts GLC illustrated in FIGS. 8A to 8C are exemplary, but the inventive concept is not limited thereto. For example, even though control circuits (e.g., 112_r1 and 112_r2) belong to the same circuit block, in the case where a gate line is not shared, the gate line cut GLC may be additionally disposed. Also, a location (e.g., the first row ROW1 or the second row ROW2) of the gate line cut GLC may be changed depending on a row at which a PMOS transistor is implemented.

As described above, as the gate line cut GLC is disposed between areas that do not share a gate line, the routing of gate lines formed on each circuit block may be implemented.

Figure 9:
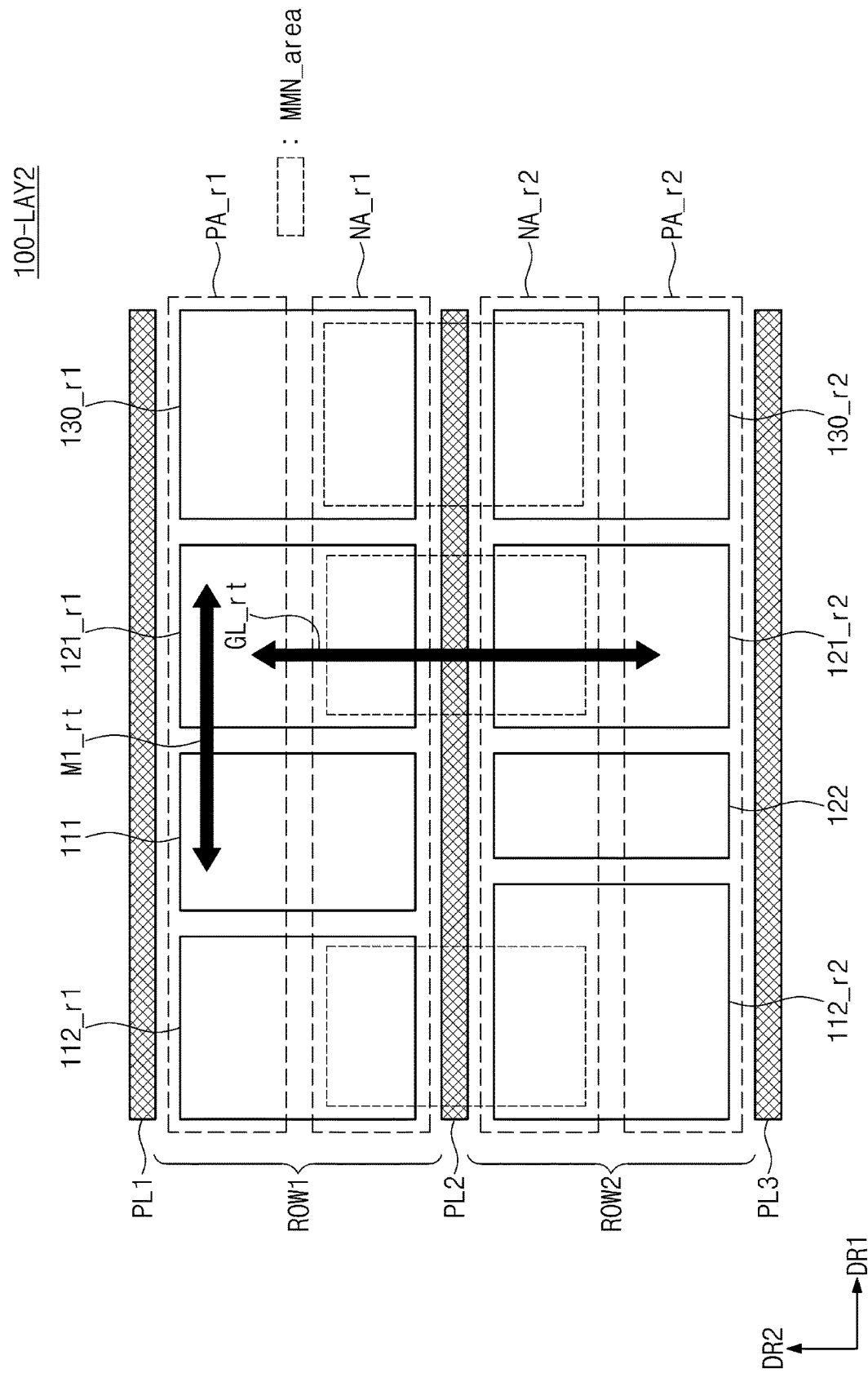
FIG. 9 is a diagram for describing routing for a clock signal of a second layout for an ICG of FIG. 5C.

FIG. 9 is a diagram for describing routing for a clock signal of a second layout for an ICG of FIG. 5C. Referring to FIG. 9, the first row ROW1 including the first PMOS area PA_r1 and the first NMOS area NA_r1 may be formed between the first and second power lines PL1 and PL2, and the second row ROW2 including the second PMOS area PA_r2 and the second NMOS area NA_r2 may be formed between the second and third power lines PL2 and PL3. The first enable signal control circuit 112_r1, the clock signal control circuit 111, the first output control circuit 121_r1, and the first output driver circuit 130_r1 may be sequentially disposed at the first row ROW1 along the first direction DR1. The second enable signal control circuit 112_r2, the feedback inverter 122, the second output control circuit 121_r2, and the second output driver circuit 130_r2 may be sequentially disposed at the second row ROW2 along the first direction DR1. Multi-finger transistors of the first and second enable signal control circuits 112_r1 and 112_r2, the first and second output control circuits 121_r1 and 121_r2, and the first and second output driver circuits 130_r1 and 130_r2 may be formed at a multi-finger transistor area distributed and arranged at the first and second rows ROW1 and ROW2. The components are described above, and thus, additional description will be omitted to avoid redundancy.

In an exemplary embodiment, in the first layout 100-LAY1 (i.e., a single row layout) described with reference to FIG. 3, because the clock signal control circuit 111 and the output control circuit 121 are spaced from each other, a routing length for a metal line for providing the clock signal CLK may increase. In this case, a periodical toggle of the clock signal CLK may cause an increase in power consumption and a signal delay of the clock signal CLK.

In contrast, as illustrated in FIG. 9, the clock signal control circuit 111 and the first output control circuit 121_r1 may be disposed adjacent to each other along the first direction DR1. In this case, the routing for the clock signal CLK used in the clock signal control circuit 111 and the first output control circuit 121_r1 may be simplified. For example, the clock signal CLK may be provided from an external clock generator to the clock signal control circuit 111 and the first output control circuit 121_r1 through a first metal line routing M1_rt formed along the first direction DR1. In the first output control circuit 121_r1, the gate signal CLK may be provided to the first transistor MMN1 through a gate line routing GL_rt formed along the second direction DR2. That is, as the clock signal control circuit 111 and the first output control circuit 121_r1 are disposed adjacent to each other, power consumption and a signal delay due to the clock signal CLK may be decreased.

FIGS. 10A to 10D are diagrams illustrating various layouts of an ICG according to an embodiment of the inventive concept. For convenience of description, additional description associated with the above components will be omitted to avoid redundancy.

Referring to FIGS. 10A to 10D, the first row ROW1 may be formed between the first and second power lines PL1 and PL2, and the second row ROW2 may be formed between the second and third power lines PL2 and PL3. The first and second enable signal control circuits 112_r1 and 112_r2, the clock signal control circuit 111, the first and second output control circuits 121_r1 and 121_r2, the feedback inverter 122, and the first and second output driver circuits 130_r1 and 130_r2 may be variously disposed at the first and second rows ROW1 and ROW2.

Figure 10A:
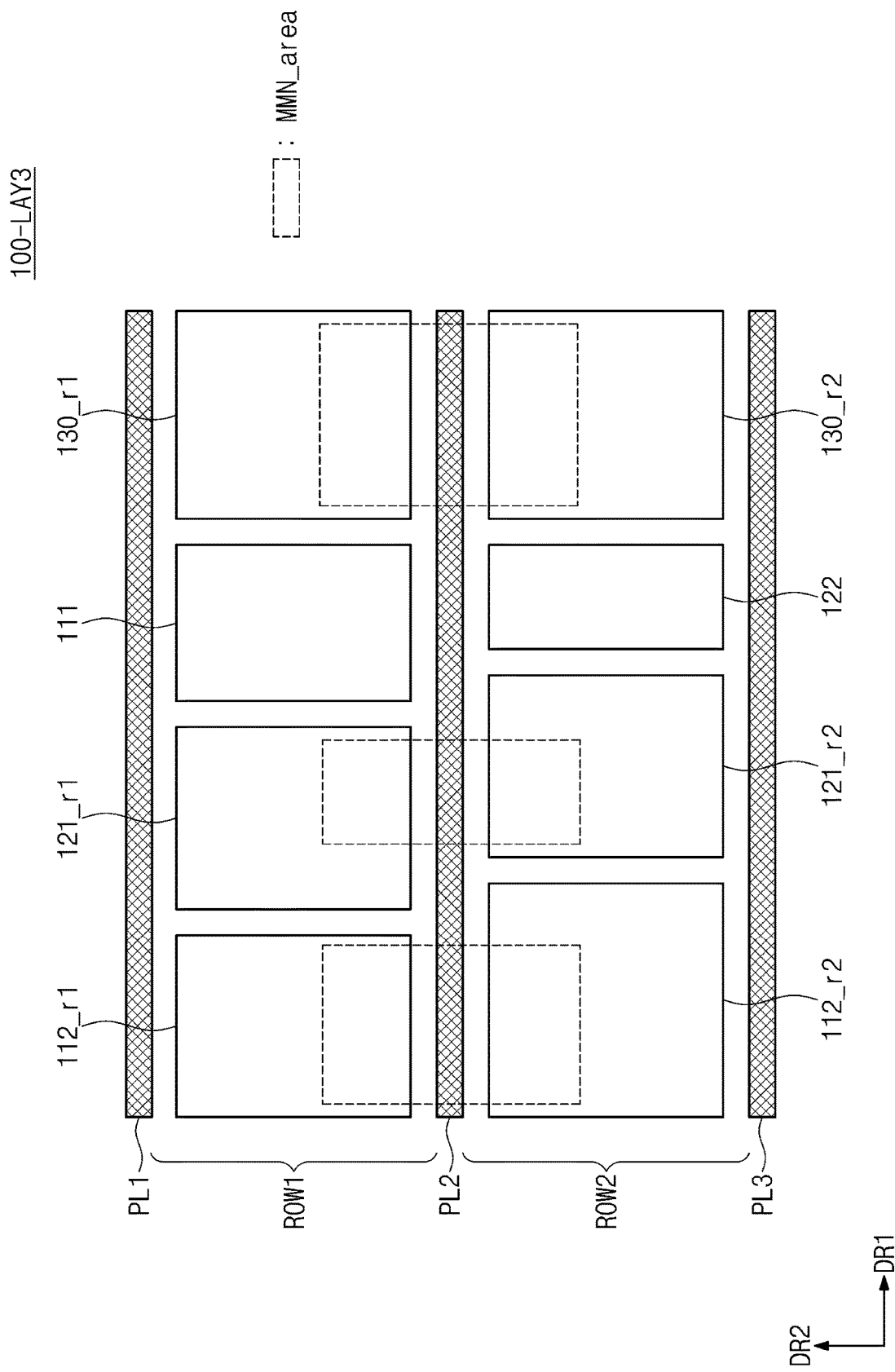

For example, as illustrated in FIG. 10A, the first enable signal control circuit 112_r1, the first output control circuit 121_r1, the clock signal control circuit 111, and the first output driver circuit 130_r1 may be sequentially disposed at the first row ROW1 along the first direction DR1, and the second enable signal control circuit 112_r2, the second output control circuit 121_r2, the feedback inverter 122, and the second output driver circuit 130_r2 may be sequentially disposed at the second row ROW2 along the first direction DR1.

Alternatively, as illustrated in FIG. 10B, the clock signal control circuit 111, the first enable signal control circuit 112_r1, the first output control circuit 121_r1, and the first output driver circuit 130_r1 may be sequentially disposed at the first row ROW1 along the first direction DR1, and the second enable signal control circuit 112_r2, the second output control circuit 121_r2, the feedback inverter 122, and the second output driver circuit 130_r2 may be sequentially disposed at the second row ROW2 along the first direction DR1.

Alternatively, as illustrated in FIG. 10C, the clock signal control circuit 111, the first enable signal control circuit 112_r1, the first output control circuit 121_r1, and the first output driver circuit 130_r1 may be sequentially disposed at the first row ROW1 along the first direction DR1, and the second enable signal control circuit 112_r2, the feedback inverter 122, the second output control circuit 121_r2, and the second output driver circuit 130_r2 may be sequentially disposed at the second row ROW2 along the first direction DR1.

Figure 10D:
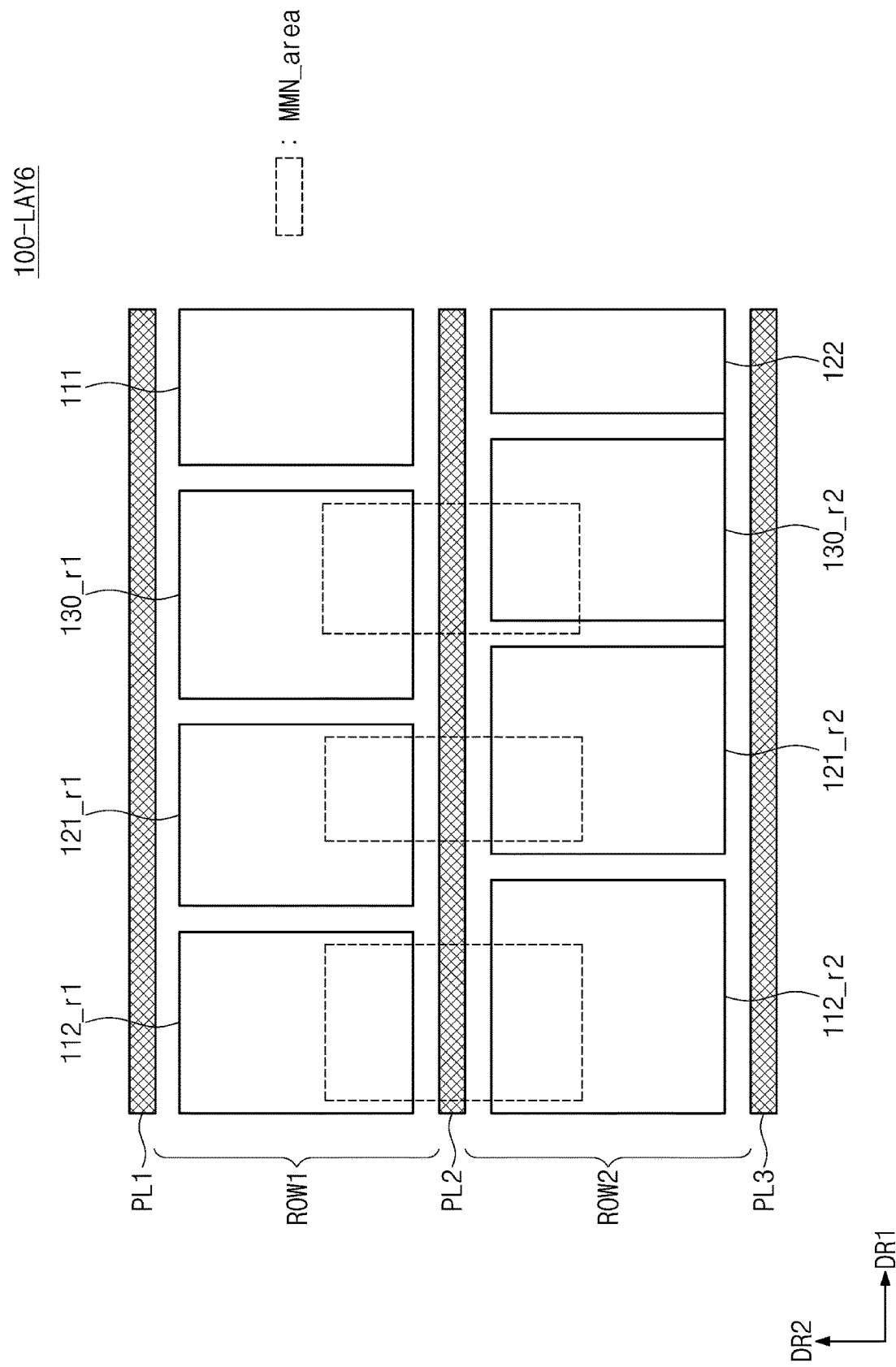

Alternatively, as illustrated in FIG. 10D, the first enable signal control circuit 112_r1, the first output control circuit 121_r1, the first output driver circuit 130_r1, and the clock signal control circuit 111 may be sequentially disposed at the first row ROW1 along the first direction DR1, and the second enable signal control circuit 112_r2, the second output control circuit 121_r2, the second output driver circuit 130_r2, and the feedback inverter 122 may be sequentially disposed at the second row ROW2 along the first direction DR1.

In an exemplary embodiment, in each of the layouts 100-LAY3 to 100-LAY6 described with reference to FIGS. 10A to 10D, control circuits included in the same control circuit may at least partially overlap in the column direction corresponding to the second direction DR2. This may be for sharing gate lines of a multi-finger transistor. Areas overlapping each other along the second direction DR2 may be the multi-finger transistor area MMN_area. A plurality of fins formed at the one multi-finger transistor area MMN_area may share the same gate lines.

The layouts 100-LAY3 to 100-LAY6 described with reference to FIGS. 10A to 10D are exemplary, and the inventive concept is not limited thereto. For example, the layouts 100-LAY3 to 100-LAY6 may be variously changed or modified without departing from the technical idea of the inventive concept.

Figure 11:
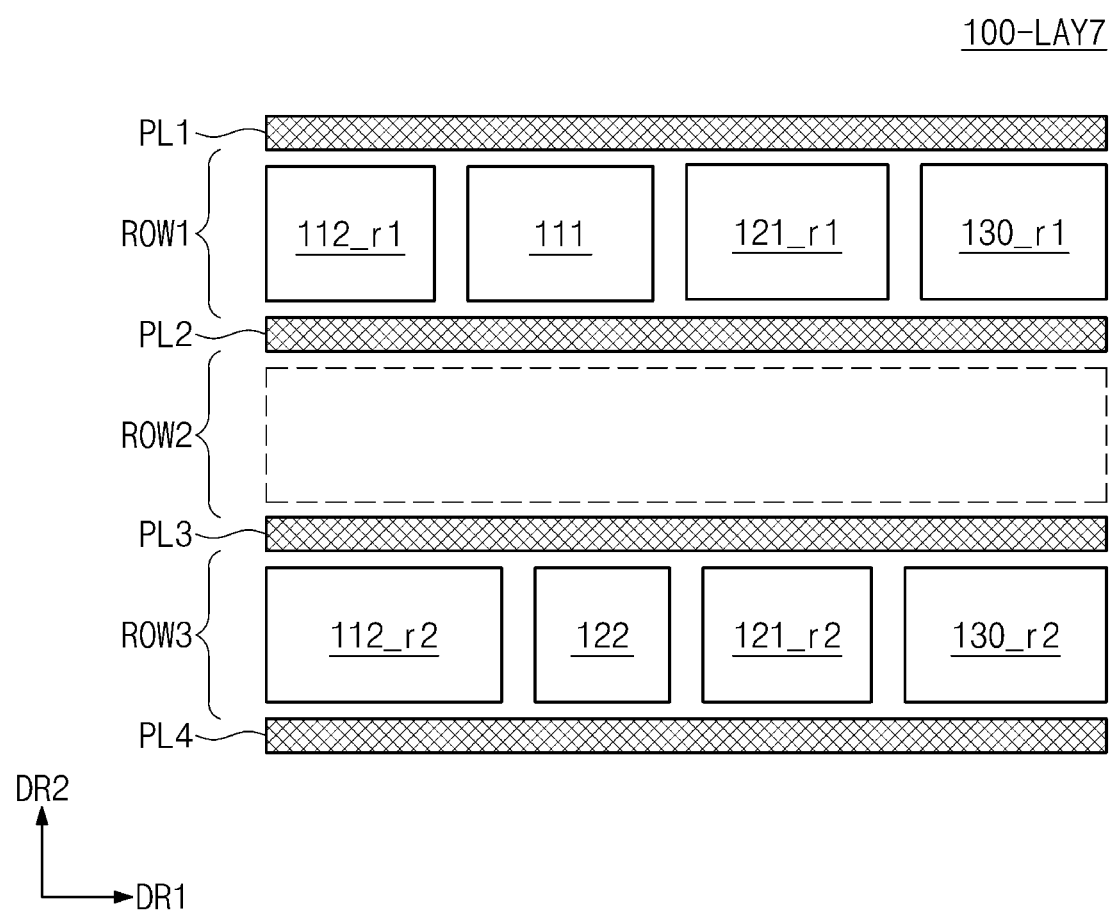
FIG. 11 is a diagram illustrating a layout of an ICG according to an embodiment of the inventive concept.

FIG. 11 is a diagram illustrating a layout of an ICG according to an embodiment of the inventive concept. For convenience of description, additional description associated with the above components will be omitted to avoid redundancy. In the above embodiments, the layouts 100-LAY2 to 100-LAY6 for the ICG 100, in which circuit blocks are distributed and arranged at two adjacent rows (e.g., the first and second rows ROW1 and ROW2) are described. However, the inventive concept is not limited thereto. For example, as illustrated in FIG. 11, the first enable signal control circuit 112_r1, the clock signal control circuit 111, the first output control circuit 121_r1, and the first output driver circuit 130_r1 may be sequentially disposed at the first row ROW1 along the first direction DR1, and the second enable signal control circuit 112_r2, the feedback inverter 122, the second output control circuit 121_r2, and the second output driver circuit 130_r2 may be sequentially disposed at the third row ROW3 along the first direction DR1.

In this case, the third row ROW3 may not be adjacent to the first row ROW1. For example, the first row ROW1 may be formed between the first and second power lines PL1 and PL2, and the third row ROW3 may be formed between the third and fourth power lines PL3 and PL4. The second row ROW2 may be formed between the second and third power lines PL2 and PL3. That is, a seventh layout 100-LAY7 according to an embodiment of the inventive concept may be formed by distributing and arranging circuit blocks of the ICG 100 at a plurality of rows not adjacent to each other.

Figure 12:
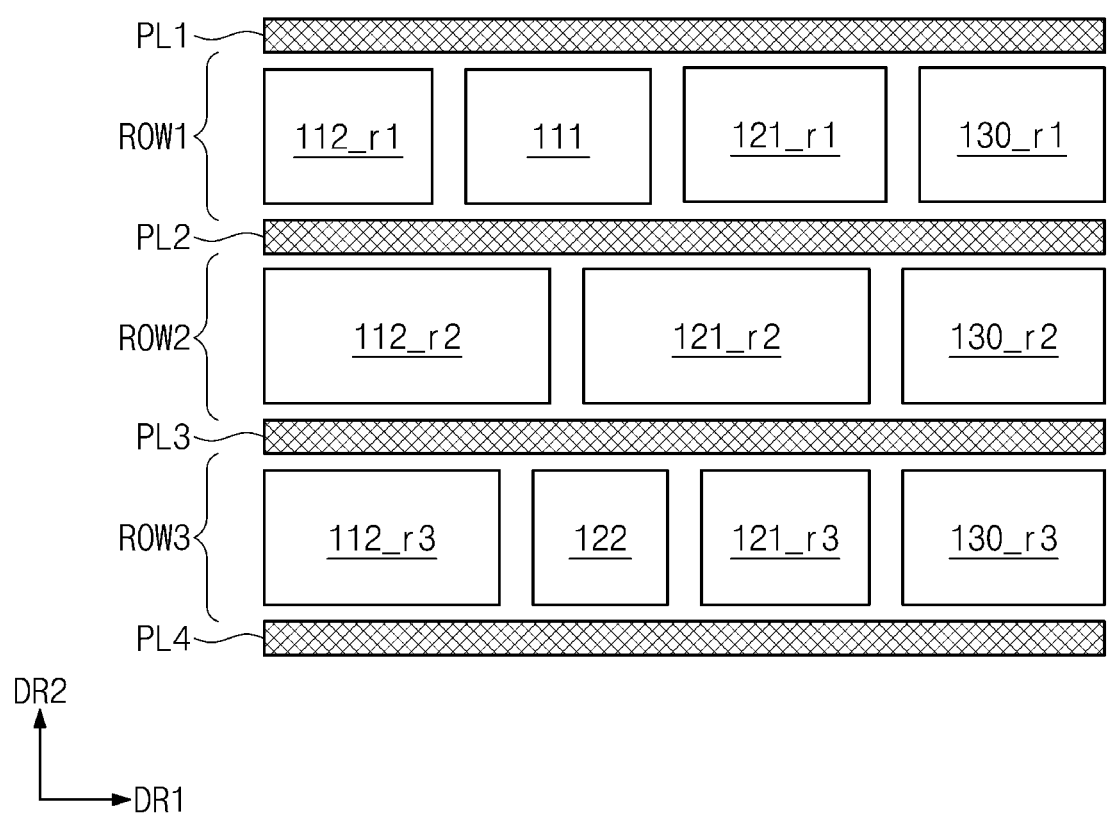
FIG. 12 is a diagram illustrating a layout of an ICG according to an embodiment of the inventive concept.

FIG. 12 is a diagram illustrating a layout of an ICG according to an embodiment of the inventive concept. For convenience of description, additional description associated with the above components will be omitted to avoid redundancy.

In the above embodiments, the layouts 100-LAY2 to 100-LAY7 for the ICG 100, in which circuit blocks are distributed and arranged at two rows are described. However, the inventive concept is not limited thereto. For example, as illustrated in FIG. 12, the first enable signal control circuit 112_r1, the clock signal control circuit 111, the first output control circuit 121_r1, and the first output driver circuit 130_r1 may be sequentially disposed at the first row ROW1 along the first direction DR1. The second enable signal control circuit 112_r2, the second output control circuit 121_r2, and the second output driver circuit 130_r2 may be sequentially disposed at the second row ROW2 along the first direction DR1. A third enable signal control circuit 112_r3, the feedback inverter 122, a third output control circuit 121_r3, and the third output driver circuit 130_r3 may be sequentially disposed at the third row ROW3 along the first direction DR1. That is, an eighth layout 100-LAY8 according to an embodiment of the inventive concept may be formed by distributing and arranging circuit blocks of the ICG 100 at a plurality of rows.

In an exemplary embodiment, control circuits included in the same circuit block may share the same gate lines, and a multi-finger transistor may be implemented by the shared gate lines.

Figure 13A:
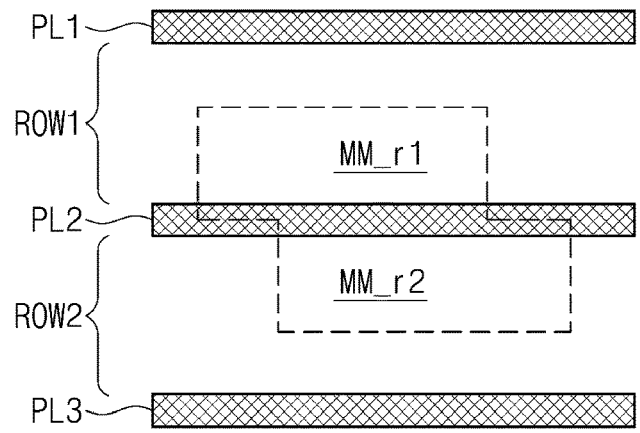
FIGS. 13A and 13B are diagrams illustrating the distribution arrangement of a multi-finger transistor according to an embodiment of the inventive concept.
Figure 13B:
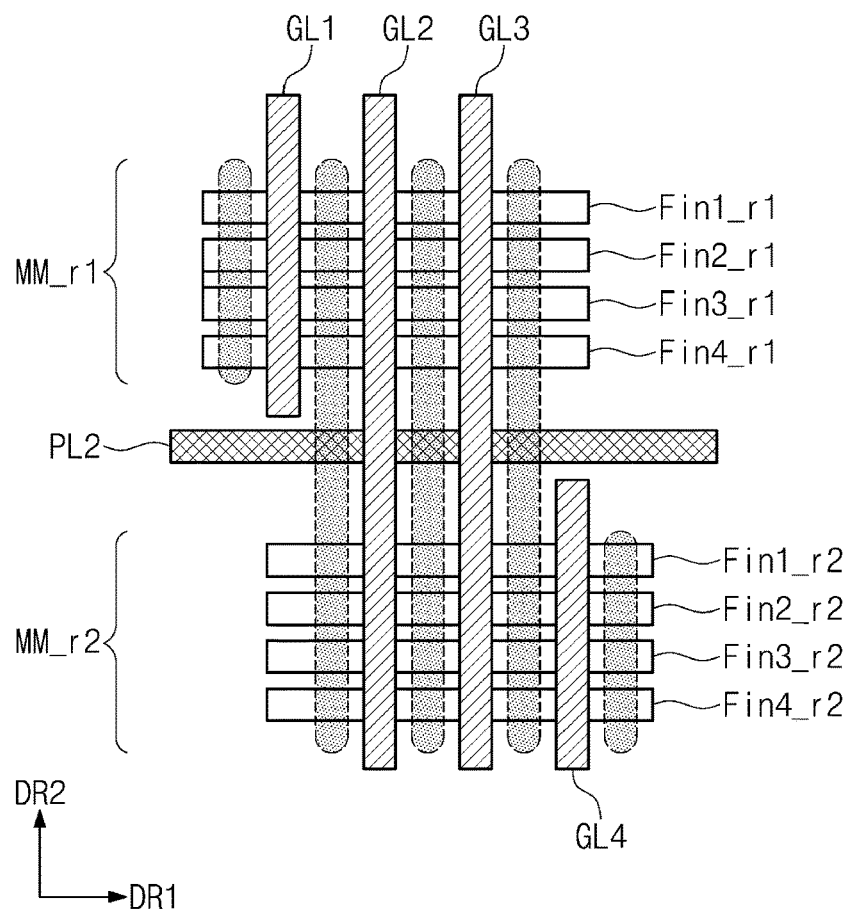

FIGS. 13A and 13B are diagrams illustrating the distribution arrangement of a multi-finger transistor according to an embodiment of the inventive concept. For convenience of description, additional description associated with the above components will be omitted to avoid redundancy. For brevity of illustration, a layout for a multi-finger transistor is illustrated as an example, but the inventive concept is not limited thereto. For example, the distribution arrangement of a multi-finger transistor to be described with reference to FIGS. 13A and 13B may be applied to the distribution arrangement of circuit blocks of an ICG described above.

Referring to FIGS. 13A and 13B, one multi-finger transistor MMN may be formed at the first row ROW1 and the second row ROW2. For example, as illustrated in FIG. 13B, the plurality of fins Fin1_r1 to Fin4_r1 may be formed along the first direction DR1 at a first multi-finger transistor area MM_r1 placed at the first row ROW1, and the plurality of fins Fin1_r2 to Fin4_r2 may be formed along the first direction DR1 at a second multi-finger transistor area MM_r2 placed at the second row ROW2.

A plurality of gate lines GL1 to GL4 may be formed along the second direction DR2. In this case, the first gate line GL1 may be connected with the plurality of fins Fin1_r1 to Fin4_r1 of the first multi-finger transistor area MM_r1, and the fourth gate line GL4 may be connected with the plurality of fins Fin1_r2 to Fin4_r2 of the second multi-finger transistor area MM_r2. The gate lines GL2 and GL3 may be connected with both the plurality of fins Fin1_r1 to Fin4_r1 of the first multi-finger transistor area MM_r1 and the plurality of fins Fin1_r2 to Fin4_r2 of the second multi-finger transistor area MM_r2. That is, in the case of implementing one multi-finger transistor, the multi-finger transistor may be distributed and arranged at a plurality of rows, and components distributed and arranged at the plurality of rows may share at least one gate line.

Figure 14:
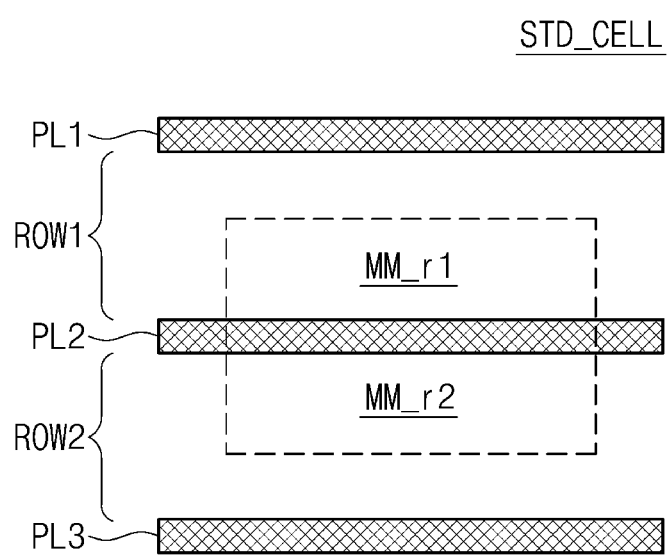
FIG. 14 is a diagram for describing a standard cell to which a layout according to the inventive concept is applied.

FIG. 14 is a diagram for describing a standard cell to which a layout according to the inventive concept is applied. Referring to FIG. 14, to design an integrated circuit easily, a standard cell STD_CELL may indicate a logic element or a function block having a shape in advance defined based on a particular manufacturing process. That is, the standard cell STD_CELL may indicate a layout for a device or device that is in advance designed to provide a function in advance defined based on a combination of a plurality of transistors.

In an exemplary embodiment, the standard cell STD_CELL may include the multi-finger transistor described above. In this case, as described above, the multi-finger transistor may be distributed and arranged at different rows. For example, one multi-finger transistor may be distributed and arranged at the first multi-finger transistor MM_r1 of the first row ROW1 and the second multi-finger transistor MM_r2 of the second row ROW2. One multi-finger transistor may be implemented by sharing gate lines and electrically connecting active contacts, as described above, with regard to the distributed and arranged components. That is, the standard cell STD_CELL may be a standard cell for the ICG 100 described above. However, the inventive concept is not limited thereto, and the standard cell STD_CELL may be a standard cell for an electronic device configured to provide various different functions.

Figure 15:
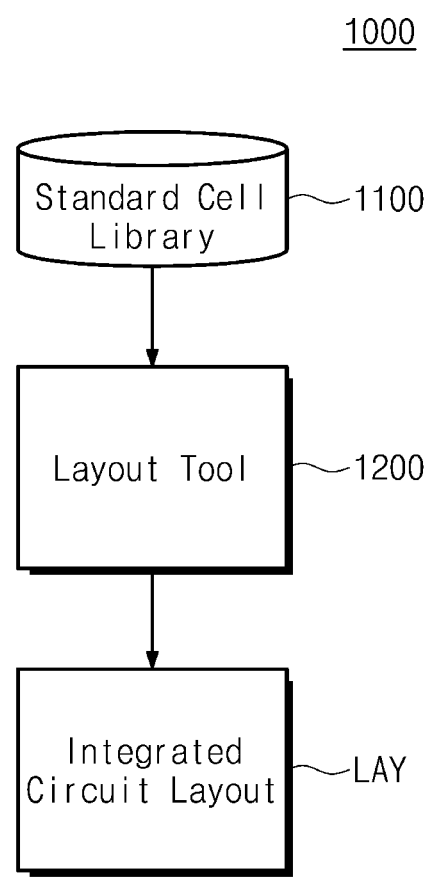
FIG. 15 is a block diagram illustrating a layout design system of a semiconductor integrated circuit.

FIG. 15 is a block diagram illustrating a layout design system of a semiconductor integrated circuit. Referring to FIG. 15, a layout design system 1000 may include a standard cell library 1100 and a layout tool 1200. The standard cell library 1100 may include a standard cell layout for various function blocks in advance designed based on a given manufacturing process. In an exemplary embodiment, the standard cell layout may include a standard cell layout for an ICG distributed and arranged at a plurality of rows described above. Alternatively, the standard cell layout may include a layout in which a multi-finger transistor is distributed and arranged at a plurality of rows.

To design an integrated circuit configured to perform an intended function, the layout tool 1200 may be configured to generate an integrated circuit layout LAY for an integrated circuit based on the standard cell library 1100. In an exemplary embodiment, various test operations may be performed based on the generated integrated circuit layout LAY, or an actual integrated circuit may be manufactured based on the generated integrated circuit layout LAY.

Figure 16:
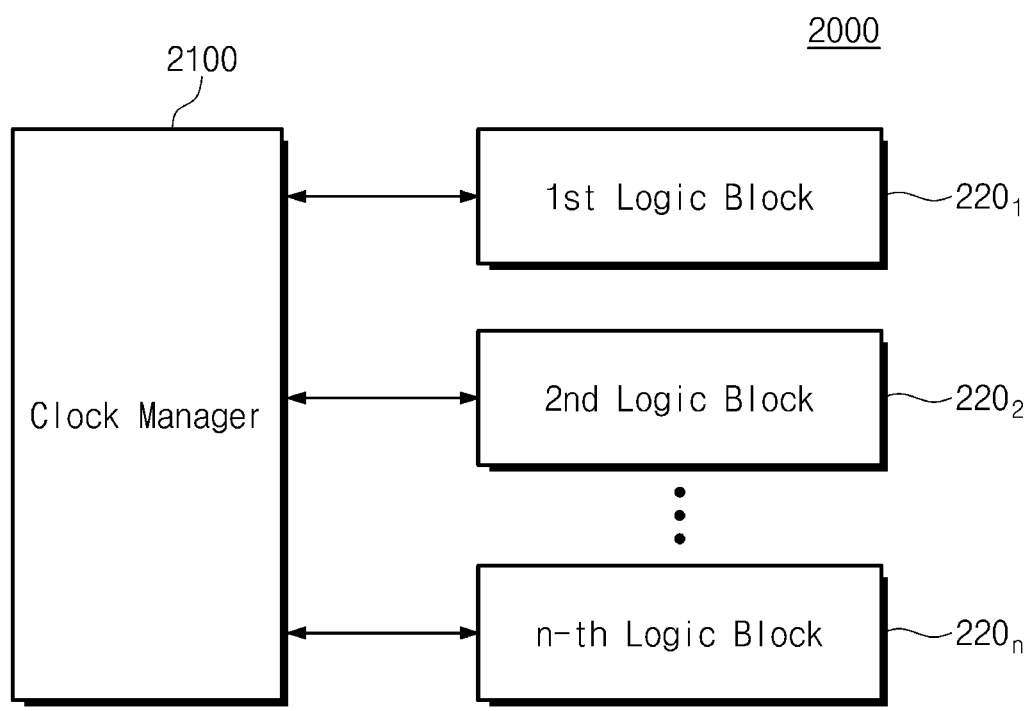
FIG. 16 is a block diagram illustrating a clock management system to which an ICG according to the inventive concept is applied.

FIG. 16 is a block diagram illustrating a clock management system to which an ICG according to the inventive concept is applied. A clock management system 2000 may include a clock manager 2100 and a plurality of logic blocks $220_1$, $220_2$, ..., $220_n$. The plurality of logic blocks $220_1$, $220_2$, ..., $220_n$ may request a clock signal from the clock manager 2100. The clock manager 2100 may provide a gated clock signal to the plurality of logic blocks $220_1$, $220_2$, ..., $220_n$ based on the request from the plurality of logic blocks $220_1$, $220_2$, ..., $220_n$. In an exemplary embodiment, the clock manager 2100 may include the ICG 100 described with reference to FIGS. 1 to 15 or may include the ICG 100 implemented based on at least one of layouts described with reference to FIGS. 1 to 15.

Figure 17:
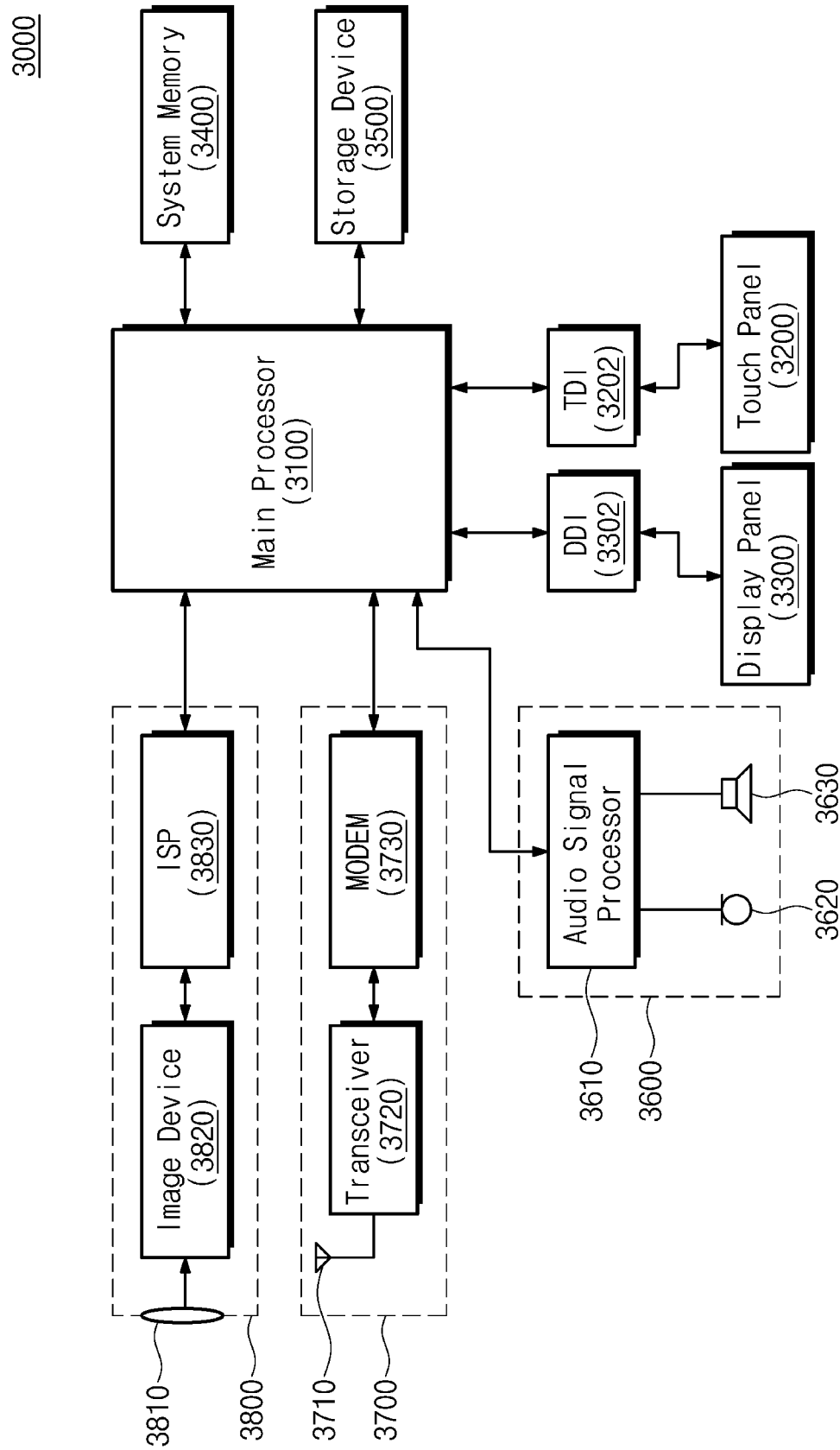
FIG. 17 is a block diagram illustrating an electronic device according to the inventive concept.

FIG. 17 is a block diagram illustrating an electronic device according to an exemplary embodiment of the inventive concept. Referring to FIG. 17, an electronic device 3000 may include a main processor 3100, a touch panel 3200, a touch driver integrated circuit 3202, a display panel 3300, a display driver integrated circuit 3302, a system memory 3400, a storage device 3500, an image processor 3800, a communication block 3700, and an audio processor 3600. According to an exemplary embodiment, the electronic device 3000 may further include a security chip. In an exemplary embodiment, the electronic device 3000 may be one of various electronic devices such as a portable communication terminal, a personal digital assistant (PDA), a portable media player (PMP), a digital camera, a smartphone, a tablet computer, a laptop computer, and a wearable device.

The main processor 3100 may control overall operations of the electronic device 3000. The main processor 3100 may control/manage operations of the components of the electronic device 3000. The main processor 3100 may process various operations for the purpose of operating the electronic device 3000.

The touch panel 3200 may be configured to sense a touch input from a user under control of the touch driver integrated circuit 3202. The display panel 3300 may be configured to display image information under control of the display driver integrated circuit 3302.

The system memory 3400 may store data that are used for an operation of the electronic device 3000. For example, the system memory 3400 may include a volatile memory such as a static random access memory (SRAM), a dynamic RAM (DRAM), or a synchronous DRAM (SDRAM), and/or a nonvolatile memory such as a phase-change RAM (PRAM), a magneto-resistive RAM (MRAM), a resistive RAM (ReRAM), or a ferroelectric RAM (FRAM).

The storage device 3500 may store data regardless of whether a power is supplied. For example, the storage device 3500 may include at least one of various nonvolatile memories such as a flash memory, a PRAM, an MRAM, a ReRAM, and a FRAM. For example, the storage device 3500 may include an embedded memory and/or a removable memory of the electronic device 3000.

The audio processor 3600 may process an audio signal by using an audio signal processor 3610. The audio processor 3600 may receive an audio input through a microphone 3620 or may provide an audio output through a speaker 3630.

The communication block 3700 may exchange signals with an external device/system through an antenna 3710. A transceiver 3720 and a modulator/demodulator (MODEM) 3730 of the communication block 3700 may process signals exchanged with the external device/system in compliance with at least one of various wireless communication protocols: long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID).

The image processor 3800 may receive a light through a lens 3810. An image device 3820 and an image signal processor 3830 included in the image processor 3800 may generate image information about an external object, based on a received light.

In an exemplary embodiment, various components (in particular, the main processor 3100) included in the electronic device 3000 may include the ICG 100 implemented based on the layout described with reference to FIGS. 1 to 16.

At least one of the components, elements, modules, or units (collectively "components" in this paragraph) represented by a block in the drawings in FIG. 17 (or other figures) may be embodied as various numbers of hardware, software and/or firmware structures that execute respective functions described above, according to an exemplary embodiment. For example, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Further, although a bus is not illustrated in the above block diagrams, communication between the components may be performed through the bus. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

According to the inventive concept, an integrated circuit gating circuit is distributed and arranged at a plurality of rows on a semiconductor substrate. As such, a length of the integrated circuit gating circuit in a row direction may be decreased in a state where the drive strength of elements included in the integrated circuit gating circuit is maintained. Accordingly, because signal wires for the integrated circuit gating circuit are simplified, a signal delay and power consumption due to an increase in the complexity of wires may be decreased. Accordingly, the integrated clock gating circuit having improved performance is provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An integrated circuit gating circuit comprising:
   a first control stage configured to output a first internal signal based on an enable signal and a clock signal;
   a second control stage connected to the first control stage through a first node, and configured to output a second internal signal based on the first internal signal and the clock signal; and
   an output driver configured to output an output clock signal based on the second internal signal,
   wherein the second control stage includes a first multi-finger transistor connected between a second node outputting the second internal signal and the first node, and configured to operate based on the clock signal, and
   wherein a first portion of the first multi-finger transistor is formed in a first row on a semiconductor substrate between a first power line and a second power line, and a second portion of the first multi-finger transistor is formed in a second row on the semiconductor substrate between the second power line and a third power line.

2. The integrated circuit gating circuit of claim 1, wherein the first portion of the first multi-finger transistor and the second portion of the first multi-finger transistor share at least one first gate line, and
wherein the at least one first gate line is extended along a first direction from the first row to the second row and the clock signal is provided to the at least one gate line.

3. The integrated circuit gating circuit of claim 2,
wherein the first portion of the first multi-finger transistor further comprises first source areas and first drain areas,
wherein the second portion of the first multi-finger transistor further comprises second source areas and second drain areas,
wherein the first source areas and the second source areas are electrically interconnected through first intermediate contacts,
wherein the first drain areas of the first portion of the first multi-finger transistor and the second drain areas of the second portion of the first multi-finger transistor are electrically interconnected through second intermediate contacts, and
wherein the first intermediate contacts and the second intermediate contacts are formed to be closer to the semiconductor substrate than a metal layer formed on the semiconductor substrate.

4. The integrated circuit gating circuit of claim 2,
wherein the first portion of the first multi-finger transistor further comprises first source areas and first drain areas,
wherein the second portion of the first multi-finger transistor further comprises second source areas and second drain areas,
wherein the first source areas of the first portion of the first multi-finger transistor and the second source areas of the second portion of the first multi-finger transistor are electrically interconnected through first metal lines, and
wherein the first drain areas of the first portion of the first multi-finger transistor and the second drain areas of the second portion of the first multi-finger transistor are electrically interconnected through second metal lines.

5. The integrated circuit gating circuit of claim 1, wherein the first control stage includes:
second and third multi-finger transistors connected in series between the first node and a ground,
wherein the second multi-finger transistor operates based on the enable signal, a third portion of the second multi-finger transistor is formed in the first row, and a fourth portion of the second multi-finger transistor is formed in the second row, and
wherein the third multi-finger transistor operates based on the first internal signal, a fifth portion of the third multi-finger transistor is formed in the first row, and a sixth portion of the third multi-finger transistor is formed in the second row.

6. The integrated circuit gating circuit of claim 5, wherein the third portion formed in the first row and the fourth portion formed in the second row share at least one second gate line to which the enable signal is provided,
wherein the fifth formed in the first row and the sixth portion formed in the second row share at least one third gate line to which the first internal signal is provided, and
wherein the at least one second gate line and the at least one third gate line are extended along a first direction from the first row to the second row.

7. The integrated circuit gating circuit of claim 1, wherein the second control stage further includes a feedback inverter configured to invert the second internal signal and to output an inverted second internal signal, and
wherein the feedback inverter is formed in the second row.

8. The integrated circuit gating circuit of claim 7, wherein the first control stage is further configured to control a voltage level at the first node based on the inverted second internal signal, the enable signal, and the first internal signal.

9. The integrated circuit gating circuit of claim 1, wherein a power supply voltage is provided to the first power line and the third power line, and a ground voltage is provided to the second power line.

10. The integrated circuit gating circuit of claim 9, wherein the first portion of the first multi-finger transistor is formed in the first row and in a first area adjacent to the second power line, and
wherein the second portion of the first multi-finger transistor is formed in the second row and in a second area adjacent to the second power line.

11. The integrated circuit gating circuit of claim 1, wherein the output driver includes at least one second multi-finger transistor,
wherein a third portion of the at least one second multi-finger transistor is formed in the first row, and a fourth portion of the at least one second multi-finger transistor is formed in the second row,
wherein the third portion of the second multi-finger transistor and the fourth portion of the second multi-finger transistor share at least one second gate line, and
wherein the second internal signal is provided to the at least one gate line.

12. An integrated circuit gating circuit comprising:
a clock signal control circuit configured to output a first internal signal based on a clock signal and a voltage level at a first node;
an enable signal control circuit configured to operate based on the first internal signal, an enable signal, and an inverted second internal signal;
an output control circuit connected to the first node, and configured to output a second internal signal based on the clock signal and the first internal signal;
a feedback inverter configured to invert the second internal signal and output the inverted second internal signal; and
an output driver configured to output an output clock signal based on the second internal signal,
wherein the clock signal control circuit is provided in a first row of a semiconductor substrate,
wherein the enable signal control circuit is distributed and arranged in the first row and a second row of the semiconductor substrate,
wherein the output control circuit is distributed and arranged at the first row and the second row,
wherein the feedback inverter is provided at the second row, and
wherein the output driver is distributed and arranged at the first row and the second row.

13. The integrated circuit gating circuit of claim 12, wherein the first row corresponds to a first area of the semiconductor substrate between a first power line and a second power line, and the second row corresponds to a second area of the semiconductor substrate between the second power line and a third power line.

14. The integrated circuit gating circuit of claim 12, wherein the enable signal control circuit includes a first enable signal control circuit provided at the first row and a second enable signal control circuit provided at the second row,
- wherein the output control circuit includes a first output control circuit provided at the first row and a second output control circuit provided at the second row, and
- wherein the output driver includes a first output driver circuit provided at the first row and a second output driver circuit provided at the second row.

15. The integrated circuit gating circuit of claim 14, wherein the first enable signal control circuit and the second enable signal control circuit are respectively provided at the first row and the second row so as to at least partially overlap each other along a column direction perpendicular to a row direction along which the first row is provided,
- wherein the first output control circuit and second output control circuit are respectively provided at the first row and the second row so as to at least partially overlap each other along the column direction, and
- wherein the first output driver circuit and second output driver circuit are respectively provided at the first row and the second row so as to at least partially overlap each other along the column direction.

16. The integrated circuit gating circuit of claim 14, wherein the first enable signal control circuit, the clock signal control circuit, the first output control circuit, and the first output driver circuit are sequentially disposed at the first row along a row direction, and
- wherein the second enable signal control circuit, the feedback inverter, the second output control circuit, and the second output driver circuit are sequentially disposed at the second row along the row direction.

17. The integrated circuit gating circuit of claim 14, wherein the first and second enable signal control circuits share at least one first gate line and at least one second gate line,
- wherein the first and second output control circuits share at least one third gate line,
- wherein the first and second output driver circuits share at least one fourth gate line, and
- wherein the enable signal is provided to the at least one first gate line, the first internal signal is provided to the at least one second gate line, the clock signal is provided to the at least one third gate line, and the second internal signal is provided to the at least one fourth gate line.

18. The integrated circuit gating circuit of claim 12, wherein each of the enable signal control circuit, the output control circuit, and the output driver includes at least one multi-finger transistor, and
- wherein the at least one multi-finger transistor included in each of the enable signal control circuit, the output control circuit, and the output driver are distributed and arranged at the first row and the second row.

19. An integrated circuit gating circuit comprising:
- a control circuit configured to output a first internal signal based on an enable signal and a clock signal; and
- an output driver configured to output an output clock signal, which is obtained by gating the clock signal, based on the first internal signal,
- wherein each of the control circuit and the output driver is distributed and arranged at a plurality of rows of a semiconductor substrate, which are separated by one or more power lines,
- wherein the control circuit includes a first multi-finger transistor configured to operate based on the clock signal and a second multi-finger transistor configured to operate the enable signal,
- wherein a first portion of the first multi-finger transistor is provided in a first row, and a second portion of the first multi-finger transistor is provided a second row, and
- wherein a third portion of the second multi-finger transistor is provided in the first row, and a fourth portion of the second multi-finger transistor is provided in the second row.

20. The integrated circuit gating circuit of claim 19, wherein the first portion of the first multi-finger transistor and the second portion of the first multi-finger transistor share at least one first gate line,
- wherein the third portion of the second multi-finger transistor and the fourth portion of the second multi-finger transistor share at least one second gate line, and
- wherein the clock signal is provided to the at least one first gate line, and the enable signal is provided to the at least one second gate line.

* * * * *